(12) United States Patent
Yu et al.

(10) Patent No.: US 11,646,715 B2
(45) Date of Patent: May 9, 2023

(54) FILTER DEVICE, RF FRONT-END DEVICE AND WIRELESS COMMUNICATION DEVICE

(71) Applicant: SHENZHEN SUNWAY COMMUNICATION CO., LTD., Guangdong (CN)

(72) Inventors: Chengcheng Yu, Shenzhen (CN); Yanjie Cao, Shenzhen (CN); Wei Wang, Shenzhen (CN)

(73) Assignee: SHENZHEN SUNWAY COMMUNICATION CO., LTD., Shenzhen (CN)

( * ) Notice: Subject to any disclaimer, the term of this patent is extended or adjusted under 35 U.S.C. 154(b) by 120 days.

(21) Appl. No.: 17/016,677

(22) Filed: Sep. 10, 2020

(65) Prior Publication Data

US 2021/0399716 A1 Dec. 23, 2021

Related U.S. Application Data

(63) Continuation of application No. PCT/CN2020/104851, filed on Jul. 27, 2020.

(30) Foreign Application Priority Data

Jun. 22, 2020 (CN) .......................... 202010571968.5

(51) Int. Cl.
*H03H 9/54* (2006.01)
*H03H 9/02* (2006.01)
(Continued)

(52) U.S. Cl.
CPC ............. *H03H 9/542* (2013.01); *H03F 3/245* (2013.01); *H03H 9/02031* (2013.01); *H03H 9/02102* (2013.01); *H03H 9/02118* (2013.01); *H03H 9/02543* (2013.01); *H03H 9/02559* (2013.01); *H03H 9/02834* (2013.01); *H03H 9/02866* (2013.01); *H03H 9/058* (2013.01);
(Continued)

(58) Field of Classification Search
CPC ...................................................... H03H 9/542
See application file for complete search history.

(56) References Cited

U.S. PATENT DOCUMENTS

| 5,726,610 A * | 3/1998 | Allen .................... H03H 9/6483 333/133 |
| 2006/0164183 A1* | 7/2006 | Tikka ..................... H03H 9/583 333/133 |

(Continued)

*Primary Examiner* — Hsinchun Liao
(74) *Attorney, Agent, or Firm* — Oliff PLC

(57) ABSTRACT

The invention provides a filter device, an RF front-end device and a wireless communication device. The filter device comprises a substrate, at least one resonance device, a passive device and a connector, wherein the at least one resonance device has a first side and a second side opposite to the first side, the substrate is located on the first side, and the passive device is located on the second side. The at least one resonance device is connected to the passive device through the connector. The RF filter device formed by integrating the resonance device (such as an SAW resonance device or a BAW resonance device) and the passive device (such as an IPD) in one die can broaden the passband width, has a high out-of-band rejection, and occupies less space in an RF front-end chip.

57 Claims, 12 Drawing Sheets

(51) Int. Cl.
*H03H 9/05* (2006.01)
*H03H 9/13* (2006.01)
*H03H 9/17* (2006.01)
*H03H 9/56* (2006.01)
*H03H 9/70* (2006.01)
*H03H 9/145* (2006.01)
*H03H 9/25* (2006.01)
*H03H 9/64* (2006.01)
*H03H 9/72* (2006.01)
*H03F 3/24* (2006.01)
*H04B 1/38* (2015.01)
*H04L 25/03* (2006.01)

(52) U.S. Cl.
CPC .......... *H03H 9/059* (2013.01); *H03H 9/0514* (2013.01); *H03H 9/0533* (2013.01); *H03H 9/132* (2013.01); *H03H 9/145* (2013.01); *H03H 9/173* (2013.01); *H03H 9/175* (2013.01); *H03H 9/176* (2013.01); *H03H 9/25* (2013.01); *H03H 9/562* (2013.01); *H03H 9/564* (2013.01); *H03H 9/6489* (2013.01); *H03H 9/703* (2013.01); *H03H 9/72* (2013.01); *H04B 1/38* (2013.01); *H04L 25/03* (2013.01); *H03F 2200/294* (2013.01); *H03F 2200/451* (2013.01)

(56) References Cited

U.S. PATENT DOCUMENTS

2014/0252568 A1* 9/2014 Hwang ............... H01L 21/82
                                                         257/659
2018/0247904 A1* 8/2018 Hsieh .................. H03H 9/1014

* cited by examiner

FILTER DEVICE, RF FRONT-END DEVICE AND WIRELESS COMMUNICATION DEVICE

TECHNICAL FIELD

The invention relates to the technical field of semiconductors, in particular to a filter device, an RF front-end device and a wireless communication device.

DESCRIPTION OF RELATED ART

The radio frequency (RF) front-end chip of wireless communication equipment includes a power amplifier, an antenna switch, an RF filter, a multiplexer, a low-noise amplifier, and the like, wherein the RF filter is a surface acoustic wave (SAW) filter, a bulk acoustic wave (BAW) filter, a micro-electro-mechanical system (MEMS) filter, an integrated passive device (IPD) filter, or the like.

SAW resonators and BAW resonators have a high quality factor value (Q value) and are used to manufacture RF filters with a low insertion loss and a high-out-of-band rejection. Wherein, Q value refers to the quality factor value of the resonators and is defined as a value obtained by dividing the center frequency by 3 dB bandwidth of the resonators. The filters manufactured from the SAW resonators and the BAW resonators have a limited passband width due to the restrictions of the electro-mechanical coupling factor of piezoelectric materials. IPDs have a broader passband width than the SAW filters and the BAW filters.

Filters integrating resonators (such as SAW resonators or BAW resonators) and IPDs can broaden the passband width and have a high out-of-band rejection. However, electrical connection of one resonator and one IPD (for example, the SAW or BAW resonator is located in a die, and the IPD is located in another die) will occupy more space in the RF front-end chip and will increase the manufacturing cost. Compared with 4G, with the rise of 5G, the RF front-end chip may comprise more RF front-end modules each including multiple RF filters, while the size of the chip has to be further decreased, and thus, space optimization has become an important factor taken into consideration when the RF filters are designed.

BRIEF SUMMARY OF THE INVENTION

The issue to be settled by the invention is to provide a filter device, which can broaden the passband width, has a high out-of-band rejection, and occupies less space in an RF front-end chip.

To settle the aforementioned issue, an embodiment of the invention provides a filter device which comprises a substrate, at least one resonance device, a passive device and a connector, wherein the at least one resonance device has a first side and a second side opposite to the first side, the substrate is located on the first side, and the passive device is located on the second side; the at least one resonance device is connected to the passive device through the connector; and the substrate, the at least one resonance device and the passive device are located in one die.

In some embodiments, the at least one resonance device includes, but is not limited to, at least one of an SAW resonance device and a BAW resonance device.

In some embodiments, the passive device comprises, but is not limited to, at least one of a capacitor, an inductor, a resistor and a through hole. In some embodiments, the passive device includes, but is not limited to, an IPD, wherein the IPD is formed through a semiconductor process.

In some embodiments, the connector includes, but is not limited to, at least one of a bump, a pad, an electrical wire and a through hole.

In some embodiments, the at least one resonance device includes a first resonance device, wherein the first resonance device comprises a first cavity, a first electrode layer, a first piezoelectric layer and a second electrode layer; at least one part of the first electrode layer is located in or over the first cavity; the first piezoelectric layer covers the first cavity, and the first cavity and the first piezoelectric layer are located on two sides of at least one part of the first electrode layer; and the second electrode layer is located on the first piezoelectric layer, and the first electrode layer and the second electrode layer are located on two sides of the first piezoelectric layer.

In some embodiments, the substrate comprises the first cavity and a first groove, wherein the first groove is located on one horizontal side of the first cavity and is communicated with the first cavity; the first electrode layer has a first terminal located in the first cavity and a second terminal located in the first groove, and the depth of the first groove is equal to the thickness of the first electrode layer; and the first piezoelectric layer is located on the first electrode layer, is a flat layer and covers the substrate.

In some embodiments, the substrate comprises the first cavity, wherein the first electrode layer is located over the first cavity and covers the first cavity; and the first piezoelectric layer is located over the substrate and covers the first electrode layer. In some embodiments, the first piezoelectric layer comprises a first protruding part located over the first electrode layer, and the second electrode layer comprises a second protruding part located on the first protruding part. In some embodiments, the first protruding part is trapezoidal or rectangular, and the second protruding part is trapezoidal or rectangular.

In some embodiments, the first cavity is located on the substrate; the first electrode layer is located on the substrate and comprises a third protruding part located over the first cavity, and the first cavity and the first piezoelectric layer are located on two sides of the third protruding part; the first piezoelectric layer is located on the substrate and comprises a fourth protruding part located over the third protruding part; and the second electrode layer comprises a fifth protruding part located on the fourth protruding part. In some embodiments, the third protruding part is trapezoidal, arched or rectangular, the fourth protruding part is trapezoidal, arched or rectangular, and the fifth protruding part is trapezoidal, arched or rectangular.

In some embodiments, the first resonance device further comprises a first intermediate layer, wherein the substrate and the first piezoelectric layer are located on two sides of the first intermediate side, and the first intermediate layer is used to block leaky waves, comprises the first cavity and is made of, but not limited to, at least one of the following materials: polymer, insulating dielectric and polysilicon. In some embodiments, the first intermediate layer further comprises a second groove, wherein the second groove is located on one horizontal side of the first cavity and is communicated with the first cavity; the first terminal of the first electrode layer is located in the first cavity, the second terminal of the first electrode layer is located in the second groove, and the depth of the second groove is equal to the thickness of the first electrode layer; and the first piezoelectric layer is located on the first electrode layer, is a flat layer and covers the first intermediate layer. In some embodiments, the first electrode layer is located over the first cavity and covers the first cavity, and the first piezoelectric layer is located over the first intermediate layer and covers the first electrode layer.

In some embodiments, the first resonance device further comprises a second intermediate layer, wherein the substrate and the first piezoelectric layer are located on two sides of the second intermediate layer, the second intermediate layer is used to block leaky waves, the first cavity is located on the second intermediate layer, and the second intermediate layer is made of, but not limited to, at least one of the following materials: polymer, insulating dielectric and polysilicon. In some embodiments, the first electrode layer is located on the second intermediate layer, and the first electrode layer comprises a sixth protruding part located over the first cavity, and the first cavity and the first piezoelectric layer are located on two sides of the sixth protruding part; the first piezoelectric layer is located on the second intermediate layer and comprises a seventh protruding part located over the sixth protruding part; and the second electrode layer comprises an eighth protruding part located on the seventh protruding part. In some embodiments, the sixth protruding part is trapezoidal, arched or rectangular, the seventh protruding part is trapezoidal, arched or rectangular, and the eighth protruding part is trapezoidal, arched or rectangular.

In some embodiments, the at least one resonance device comprises a second resonance device, wherein the second resonance device comprises a first reflection layer, a third electrode layer, a second piezoelectric layer and a fourth second piezoelectric layer; the third electrode layer is located on the first reflection layer; the second piezoelectric layer is located over the first reflection layer and covers the third electrode layer; and the fourth electrode layer is located on the second piezoelectric layer, and the third electrode layer and the fourth electrode layer are located on two sides of the second piezoelectric layer.

In some embodiments, the first reflection layer is located on the substrate and comprises first sub-reflection layers and second sub-reflection layers, wherein the first sub-reflection layers and the second sub-reflection layers are disposed alternately and are made of different materials. In some embodiments, the first reflection layers are Bragg reflection layers. In some embodiments, the second piezoelectric layer comprises a ninth protruding part located over the third electrode layer, and the fourth electrode layer comprises a tenth protruding part located on the ninth protruding part.

In some embodiments, the at least one resonance device comprises a third resonance device, wherein the third resonance device comprises a third piezoelectric layer and a fifth electrode layer located on the third piezoelectric layer. In some embodiments, the fifth electrode layer comprises, but is not limited to, an interdigital transducer. In some embodiments, the fifth electrode layer comprises first electrode bars and second electrode bars, wherein the polarity of the first electrode bars is different from that of the second electrode bars, and the first electrode bars and the second electrode bars are disposed alternately.

In some embodiments, the third resonance device further comprises a third intermediate layer, wherein the third piezoelectric layer is located on the third intermediate layer, the substrate and the third piezoelectric layer are located on two sides of the third intermediate layer, and the third intermediate layer is used to block leaky waves or is used for temperature compensation. In some embodiments, the third resonance device further comprises a fourth intermediate layer, wherein the third intermediate layer is located on the fourth intermediate layer, the substrate and the third intermediate layer are located on two sides of the fourth intermediate layer, and the fourth intermediate layer is used to block leaky waves.

In some embodiments, the third resonance device further comprises a second reflection layer, wherein the third piezoelectric layer is located on the second reflection layer, and the substrate and the third piezoelectric layer are located on two sides of the second reflection layer. In some embodiments, the second reflection layer comprises third sub-reflection layers and fourth sub-reflection layers, wherein the third sub-reflection layers and the fourth sub-reflection layers are disposed alternately and are made of different materials. In some embodiments, the second reflection layers include Bragg reflection layers.

In some embodiments, the substrate is made of, but not limited to, at least one of the following materials: aluminum nitride, aluminum oxide alloy, gallium nitride, zinc oxide, lithium tantalite, lithium niobate, lead zirconate titanate and lead magnesium niobate-lead titanate. In some embodiments, the at least one resonance device comprises a fourth resonance device, wherein the fourth resonance device comprises a sixth electrode layer located on the substrate, and the sixth electrode layer comprises an interdigital transducer. In some embodiments, the fourth resonance device further comprises a temperature compensation layer located on the substrate and covering the sixth electrode layer.

An embodiment of the invention further provides an RF front-end device which comprises a power amplification device and at least one filter device provided by one of the aforementioned embodiments, wherein the power amplification device is connected to the filter device.

An embodiment of the invention further provides an RF front-end device which comprises a low-noise amplification device and at least one filter device provided by one of the aforementioned embodiments, wherein the low-noise amplification device is connected to the filter device.

An embodiment of the invention further provides an RF front-end device which comprises a multiplexing device, wherein the multiplexing device comprises at least one filter device provided by one of the aforementioned embodiments.

An embodiment of the invention further provides a wireless communication device which comprises an antenna, a baseband processing device and the RF front-end device provided by one of the aforementioned embodiments, wherein the antenna is connected to a first terminal of the RF front-end device, and the baseband processing device is connected to a second terminal of the RF front-end device.

From the above description, the invention provides a filter device which comprises at least one resonance device (such as a BAW resonance device or an SAW resonance device) and a passive device (such as an IPD), wherein the at least one resonance device and the passive device are located in one die, so that the passband width can be broadened, a high out-of-band rejection is obtained, and less space in an RF front-end chip is occupied. In addition, compared with electrical connection of one resonance device and one passive device, the integration of the resonance device and the passive device in one die can reduce electrical transmission losses, thus improving the performance of the filter device.

BRIEF DESCRIPTION OF THE SEVERAL VIEWS OF THE DRAWINGS

FIG. 2c (ii) is a structural diagram of a crystal of a tetragonal system;

FIG. 2c (iii) is a structural diagram of a crystal of a cubic system;

Figure 1:
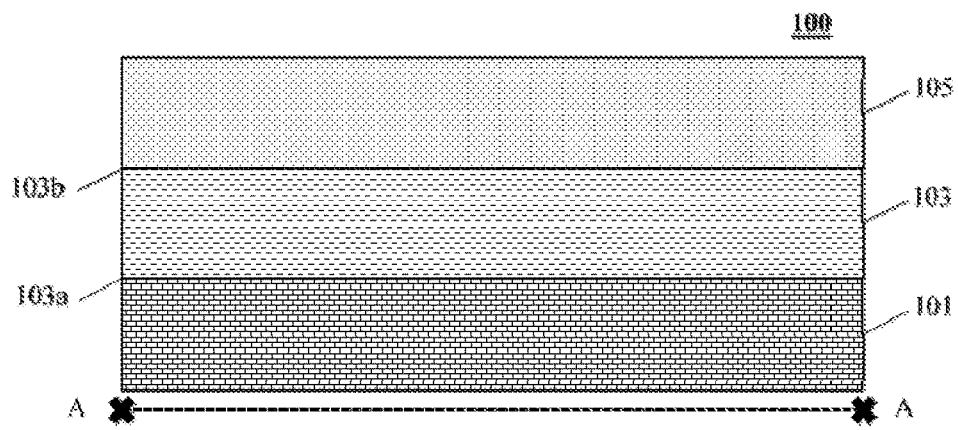
FIG. 1 is a structural diagram of cross-section A of a filter device 100 in an embodiment of the invention.

It should be noted that cross-section A and cross-section B are two orthogonal cross-sections.

DETAILED DESCRIPTION OF THE INVENTION

To gain a better understanding of the purposes, features and advantages of the invention, the specific implementations of the invention are expounded below in conjunction with the accompanying drawings.

Many specific details are given in the following description to obtain a comprehensive appreciation of the invention. Clearly, the invention can also be implemented through other embodiments different from those described hereinafter. Hence, the invention is not limited to the specific embodiments disclosed below.

As described in the description of related art, electrical connection of one resonance device and one passive device (for example, an SAW resonance device or a BAW resonance device is located in a die, and an IPD is located in another die) will occupy more space in the RF front-end chip and will increase the manufacturing cost.

The inventor of the invention finds that a resonance device (such as an SAW resonance device or a BAW resonance device) and a passive device (such as an IPD) can be integrated in one die to form an RF filter device, which can optimize the passband width, has a high out-of-band rejection, and occupies less space in the RF front-end chip.

The inventor of the invention also finds that compared with electrical connection of one resonance device and one passive device, the integration of the resonance device and the passive device in one die can reduce electrical transmission losses, thus improving the filter performance.

To settle the aforesaid issue, an embodiment of the invention provides a filter device which comprises a substrate, at least one resonance device, a passive device and a connector, wherein the at least one resonance device has a first side and a second side opposite to the first side, the substrate is located on the first side, and the passive device is located on the second side; and the at least one resonance device is connected to the passive device through the connector.

In this embodiment, the substrate, the at least one resonance device and the passive device are located in one die. In this embodiment, the at least one resonance device includes, but is not limited to, at least one of an SAW resonance device and a BAW resonance device. In this embodiment, the passive device comprises, but is not limited to, at least one of a capacitor, an inductor, a resistor and a through hole. In this embodiment, the passive device includes, but is not limited to, an IPD, wherein the IPD is formed through a semiconductor process. In this embodiment, the connector includes, but is not limited to, at least one of a bump, a pad, an electrical wire and a through hole.

It should be noted that the RF filter device formed by integrating a resonance device (such as an SAW resonance device or a BAW resonance device) and the passive device (such as an IPD) in one die can broaden the passband width, has a high out-of-band rejection, and occupies less space in an RF front-end chip.

In addition, compared with electrical connection of one resonance device and one passive device, the integration of the resonance device and the passive device in one die can reduce electrical transmission losses, thus improving the filter performance.

In some embodiment, the at least one resonance device includes a first resonance device, wherein the first resonance device comprises a first cavity, a first electrode layer, a first piezoelectric layer and a second electrode layer, wherein at least one part of the first electrode layer is located in or over the first cavity; the first piezoelectric layer covers the first cavity, and the first cavity and the first piezoelectric layer are located on two sides of at least one part of the first electrode layer; and the second electrode layer is located on the first piezoelectric layer, and the first electrode layer and the second electrode layer are located on two sides of the first piezoelectric layer.

In some embodiments, the substrate comprises a first cavity and a first groove, wherein the first groove is located on one horizontal side of the first cavity and is communicated with the first cavity; the first electrode layer has a first terminal located in the first cavity and a second terminal located in the first groove, and the depth of the first groove is equal to the thickness of the first electrode layer; and the first piezoelectric layer is located on the first electrode layer, is a flat layer and covers the substrate.

In some embodiments, the substrate comprises the first cavity, wherein the first electrode layer is located over the first cavity and covers the first cavity; and the first piezoelectric layer is located over the substrate and covers the first electrode layer. In some embodiments, the first piezoelectric layer comprises a first protruding part located over the first electrode layer, and the second electrode layer comprises a second protruding part located on the first protruding part. In some embodiments, the first protruding part is trapezoidal or rectangular, and the second protruding part is trapezoidal or rectangular.

In some embodiments, the first cavity is located on the substrate; the first electrode layer is located on the substrate and comprises a third protruding part located over the first cavity, and the first cavity and the first piezoelectric layer are located on two sides of the third protruding part; the first piezoelectric layer is located on the substrate and comprises a fourth protruding part, and the fourth protruding part is located over the third protruding part; and the second electrode layer comprises a fifth protruding part located on the fourth protruding part. In some embodiments, the third protruding part is trapezoidal, arched or rectangular, the fourth protruding part is trapezoidal, arched or rectangular, and the fifth protruding part is trapezoidal, arched or rectangular.

In some embodiments, the first resonance device further comprises a first intermediate layer, wherein the substrate and the first piezoelectric layer are located on two sides of the first intermediate side, and the first intermediate layer is used to block leaky waves, comprises the first cavity and is made of, but not limited to, at least one of the following materials: polymer, insulating dielectric and polysilicon. In some embodiments, the first intermediate layer further comprises a second groove, wherein the second groove is located on one horizontal side of the first cavity and is communicated with the first cavity; the first terminal of the first electrode layer is located in the first cavity, the second terminal of the first electrode layer is located in the second groove, and the depth of the second groove is equal to the thickness of the first electrode layer; and the first piezoelectric layer is located on the first electrode layer, is a flat layer and covers the first intermediate layer. In some embodiments, the first electrode layer is located over the first cavity and covers the first cavity, and the first piezoelectric layer is located over the first intermediate layer and covers the first electrode layer.

In some embodiments, the first resonance device further comprises a second intermediate layer, wherein the substrate and the first piezoelectric layer are located on two sides of the second intermediate layer, the second intermediate layer is used to block leaky waves, the first cavity is located on the second intermediate layer, and the second intermediate layer is made of, but not limited to, at least one of the following materials: polymer, insulating dielectric and polysilicon. In some embodiments, the first electrode layer is located on the second intermediate layer, and the first electrode layer comprises a sixth protruding part located over the first cavity, and the first cavity and the piezoelectric layer are located on two sides of the sixth protruding part; the first piezoelectric layer is located on the second intermediate layer and comprises a seventh protruding part located over the sixth protruding part; and the second electrode layer comprises an eighth protruding part located on the seventh protruding part. In some embodiments, the sixth protruding part is trapezoidal, arched or rectangular, the seventh protruding part is trapezoidal, arched or rectangular, and the eighth protruding part is trapezoidal, arched or rectangular.

In some embodiments, the at least one resonance device comprises a second resonance device, wherein the second resonance device comprises a first reflection layer, a third electrode layer, a second piezoelectric layer and a fourth electrode layer; the third electrode layer is located on the first reflection layer; the second piezoelectric layer is located over the first reflection layer and covers the third electrode layer, and the fourth electrode layer located on the second piezoelectric layer; and the third electrode layer and the fourth electrode layer are located on two sides of the second piezoelectric layer.

In some embodiments, the first reflection layer is located on the substrate and comprises first sub-reflection layers and second sub-reflection layers, wherein the first sub-reflection layers and the second sub-reflection layers are disposed alternately and are made of different materials. In some embodiments, the first reflection layers include Bragg reflection layers. In some embodiments, the second piezoelectric layer comprises a ninth protruding part located over the third electrode layer, and the fourth electrode layer comprises a tenth protruding part located on the ninth protruding part.

In some embodiments, the at least one resonance device comprises a third resonance device, wherein the third resonance device comprises a third piezoelectric layer and a fifth electrode layer located on the third piezoelectric layer. In some embodiments, the fifth electrode layer comprises, but is not limited to, an interdigital transducer. In some embodiments, the fifth electrode layer comprises first electrode bars and second electrode bars, wherein the polarity of the first electrode bars is different from that of the second electrode bars, and the first electrode bars and the second electrode bars are disposed alternately.

In some embodiments, the third resonance device further comprises a third intermediate layer, wherein the third piezoelectric layer is located on the third intermediate layer, the substrate and the third piezoelectric layer are located on two sides of the third intermediate layer, and the third intermediate layer is used to block leaky waves or is used for temperature compensation. In some embodiments, the third resonance device further comprises a fourth intermediate layer, the third intermediate layer is located on the fourth intermediate layer, the substrate and the third intermediate layer are located on two sides of the fourth intermediate layer, and the fourth intermediate layer is used to block leaky waves.

In some embodiments, the third resonance device further comprises a second reflection layer, wherein the third piezoelectric layer is located on the second reflection layer, and the substrate and the third piezoelectric layer are located on two sides of the second reflection layer. In some embodiments, the second reflection layer comprises third sub-reflection layers and fourth sub-reflection layers, wherein the third sub-reflection layers and the fourth sub-reflection layers are disposed alternately and are made of different materials. In some embodiments, the second reflection layers include Bragg reflection layers.

In some embodiments, the substrate is made of, but not limited at least one of the following materials: aluminum nitride, aluminum oxide alloy, gallium nitride, zinc oxide, lithium tantalite, lithium niobate, lead zirconate titanate and lead magnesium niobate-lead titanate. In some embodiments, the at least one resonance device comprises a fourth resonance device, wherein the fourth resonance device comprises a sixth electrode layer located on the substrate, and the sixth electrode layer comprises an interdigital transducer. In some embodiments, the fourth resonance device further comprises a temperature compensation layer located on the substrate and covering the sixth electrode layer.

An embodiment of the invention further provides an RF front-end device which comprises a power amplification device and at least one filter device provided by one of the aforementioned embodiments, wherein the power amplification device is connected to the filter device.

An embodiment of the invention further provides an RF front-end device which comprises a low-noise amplification device and at least one filter device provided by one of the aforementioned embodiments, wherein the low-noise amplification device is connected to the filter device.

An embodiment of the invention further provides an RF front-end device which comprises a multiplexing device, wherein the multiplexing device comprises at least one filter device provided by one of the aforementioned embodiments.

An embodiment of the invention further provides a wireless communication device which comprises an antenna, a baseband processing device and the RF front-end device provided by one of the aforementioned embodiments, wherein the antenna is connected to a first terminal of the RF front-end device, and the baseband processing device is connected to a second terminal of the RF front-end device.

FIG. 1 to FIG. 14 illustrate multiple specific embodiments of the invention. The multiple specific embodiments adopt resonance devices of different structures. Clearly, the invention can also be implemented through other embodiments different from those described hereinafter. Hence, the invention is not limited to the specific embodiments described below.

FIG. 1 is a structural diagram of cross-section A of a resonance device 100 in an embodiment of the invention.

As shown in FIG. 1, an embodiment of the invention provides a filter device 100 which comprises a substrate 101, at least one resonance device 103 and a passive device 105, wherein the substrate 101 is a die substrate, the at least one resonance device 103 is located over the substrate 101, the passive device 105 is located over the at least one resonance device 103, and the at least one resonance device 103 is electrically connected to the passive device 105.

In this embodiment, the substrate 101 is located on a first side 103a of the at least one resonance device 103, and the passive device 105 is located on a second side 103b of the at least one resonance device 103. In this embodiment, the substrate 101, the at least one resonance device 103 and the passive device 105 are integrated in one die.

In this embodiment, the substrate 101 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the at least one resonance device 103 includes, but is not limited to, at least one of an SAW resonance device and a BAW resonance device.

In this embodiment, the passive device 105 comprises, but is not limited to, at least one of a capacitor, an inductor, a resistor and a through hole. It should be noted that any passive devices (such as IPDs) known by those skilled in the art can be applied to the embodiment of the invention.

It should be noted that the filter device formed by integrating the resonance device and the passive device in one die can broaden the passband width, has a high out-of-band rejection, and occupies less space in an RF front-end chip.

FIG. 2 is a structural diagram of cross-section A of a filter device 200 in an embodiment of the invention.

Figure 2A:
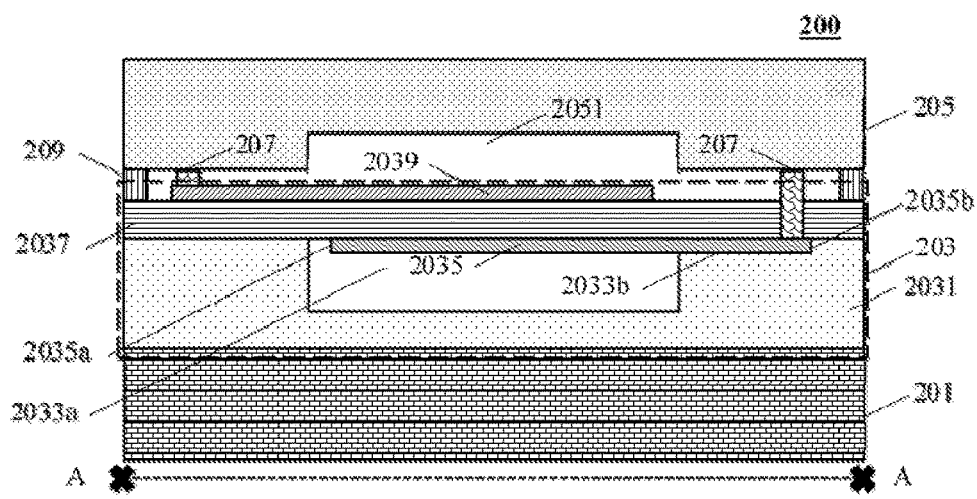
FIG. 2a is a structural diagram of cross-section A of a filter device 200 in an embodiment of the invention.

As shown in FIG. 2a, an embodiment of the invention provides a filter device 200 which comprises a substrate 201, a BAW resonance device 203 and a passive device 205, wherein the substrate 201 is a die substrate, the BAW resonance device 203 is located over the substrate 201, the passive device 205 is located over the BAW resonance device 203, and the BAW resonance device 203 is electrically connected to the passive device 205 through connectors 207.

In this embodiment, the substrate 201 and the passive device 205 are located on two sides of the BAW resonance device 203 respectively. In this embodiment, the substrate 201, the BAW resonance device 203 and the passive device 205 are integrated in one die.

In this embodiment, the substrate 201 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the BAW resonance device 203 comprises an intermediate layer 2031, an electrode layer 2035, a piezoelectric layer 2037 and an electrode layer 2039, wherein the intermediate layer 2031 is located on the substrate 201, a cavity 2033a and a groove 2033b are formed in the upper surface of the intermediate layer 2031, the groove 2033b is located on one of the left and right sides (namely, one horizontal side) of the cavity 2033a and is communicated with the cavity 2033a, and the depth of the groove 2033b is smaller than that of the cavity 2033a; a first terminal 2035a of the electrode layer 2035 is located in the cavity 2033a, a second terminal 2035b of the electrode layer 2035 is located in the groove 2033b and is opposite to the first terminal 2035a, and the depth of the groove 2033b is equal to the thickness of the electrode layer 2035; the piezoelectric layer 2037 is located on the electrode layer 2035, the substrate 201 and the piezoelectric layer 2037 are located on two sides of the intermediate layer 2031 respectively, and the piezoelectric layer 2037 is a flat layer and at least covers the cavity 2033a; the electrode layer 2039 is located on the piezoelectric layer 2037, and the electrode layer 2035 and the electrode layer 2039 are located on two sides of the piezoelectric layer 2037 respectively; and a resonance region (namely, an overlap region of the electrode layer 2035 and the electrode layer 2039) is suspended with respect to the cavity 2033a and does not overlap with the intermediate layer 2031.

In this embodiment, the intermediate layer 2031 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the electrode layer 2035 is made of, but not limited to, at least one of the following materials: molybdenum, ruthenium, tungsten, platinum, iridium, aluminum and beryllium.

In this embodiment, the piezoelectric layer 2037 covers the upper surface of the intermediate layer 2031. In this embodiment, the intermediate layer 2031 and the passive device 205 are located on two sides of the piezoelectric layer 2037 respectively. In this embodiment, the piezoelectric layer 2037 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate. It should be noted that the acoustic resistance of the material of the intermediate layer 2031 is different from that of the material of the piezoelectric layer 2037, so that leaky waves in a lateral mode can be blocked.

Figure 2B:
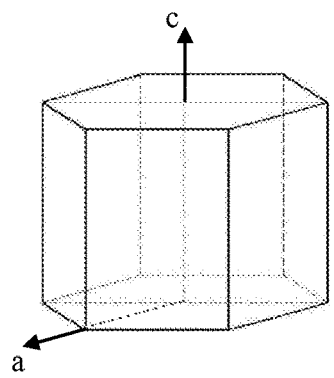
FIG. 2b is a structural diagram of a crystal of a hexagonal system.
Figure 2C:
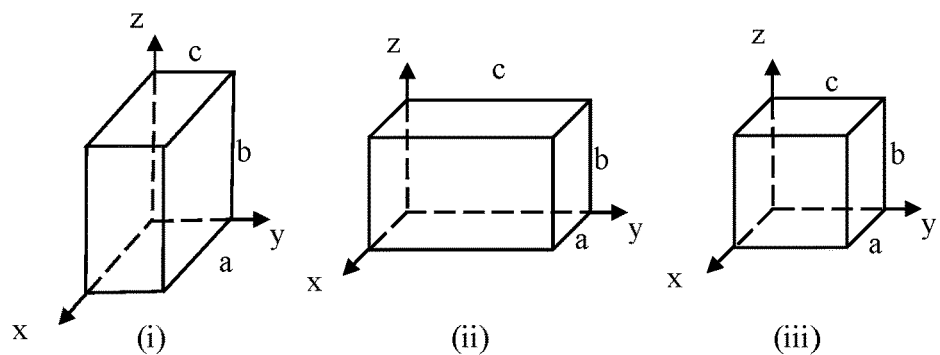
FIG. 2c (i) is a structural diagram of a crystal of a orthorhombic system.

In this embodiment, the piezoelectric layer 2037 comprises multiple crystals, wherein the multiple crystals include a first crystal and a second crystal, and the first crystal and the second crystal are any two crystals of the multiple crystals. As is known to those skilled in the art that the orientation and plane of crystals can be represented by coordinate systems. For example, as shown in FIG. 2b, a crystal of a hexagonal system, such as an aluminum nitride crystal, can be represented by an ac three-dimensional coordinate system (including an a-axis and a c-axis). For another example, as shown in FIG. 2c, crystals of an orthorhombic system (a≠b≠c) (i), a tetragonal system (a=b≠c) (ii) and a cubic system (a=b=c) (iii) can be represented by an xyz three-dimensional coordinate system (including an x-axis, a y-axis and a z-axis). In addition to these two examples, the crystals can also be represented by other coordinate systems known by those skilled in the art, and thus, the invention is not limited to the two aforementioned examples.

In this embodiment, the first crystal may be represented by a first three-dimensional coordinate system, and the second crystal may be represented by a second three-dimensional coordinate system, wherein the first three-dimensional coordinate system at least includes a first coordinate axis in a first direction and a third coordinate axis in a third direction, the second three-dimensional coordinate system at least includes a second coordinate axis in a second direction and a fourth coordinate axis in a fourth direction, the first coordinate axis corresponds to the height of the first crystal, and the second coordinate axis corresponds to the height of the second crystal.

In this embodiment, the first direction is identical with or opposite to the second direction. It should be noted that, when the first direction is identical with the second direction, an angle between a vector in the first direction and a vector in the second direction ranges from 0° to 5°, and that when the first direction is opposite to the second direction, the angle between the vector in the first direction and the vector in the second direction ranges from 175° to 180°.

In another embodiment, the first three-dimensional coordinate system is an ac three-dimensional coordinate system, wherein the first coordinate axis is a first c-axis, and the third coordinate axis is a first a-axis; and the second three-dimensional coordinate system is also an ac three-dimensional coordinate system, wherein the second coordinate axis is a second c-axis, the fourth coordinate axis is a second a-axis, and the first c-axis and the second c-axis are in the same direction or in opposite directions.

In another embodiment, the first three-dimensional coordinate system further includes a fifth coordinate axis in a fifth direction, and the second three-dimensional coordinate system further includes a sixth coordinate axis in a sixth direction. In another embodiment, the first direction is identical with or opposite to the second direction, and the third direction is identical with or opposite to the fourth direction. It should be noted that, when the third direction is identical with the fourth direction, an angle between a vector in the third direction and a vector in the fourth direction ranges from 0° to 5°, and that when the third direction is opposite to the fourth direction, the angle between the vector in the third direction and the vector in the fourth direction ranges from 175° to 180°.

In another embodiment, the first three-dimensional coordinate system is an xyz three-dimensional coordinate system, wherein the first coordinate axis is a first z-axis, the third coordinate axis is a first y-axis, and the fifth coordinate axis is a first x-axis; and the second three-dimensional coordinate system is also an xyz three-dimensional coordinate system, wherein the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite directions, and the first y-axis and the second y-axis are in opposite directions. In another embodiment, the first z-axis and the second z-axis are in the same direction, and the first y-axis and the second y-axis are in opposite directions. In another embodiment, the first z-axis and the second z-axis are in opposite directions, and the first y-axis and the second y-axis are in the same direction.

In this embodiment, the piezoelectric layer 2037 comprises multiple crystals, wherein the full width at half maximum (FWHM) of rocking curves of the multiple crystals is less than 2.5°. It should be noted that the rocking curve depicts the angular divergence of a specific crystal plane (determined by the diffraction angle) on a sample and is represented by a planar coordinate system, wherein the horizontal axis represents the angle between the crystal plane and the sample, the vertical axis represents the diffraction intensity of the crystal plane under a certain angle, the rocking curve indicates the crystal lattice quality, and the smaller the FWHM, the higher the crystal lattice quality. In addition, the FWHM indicates the distance between points with two consecutive functional values equal to half of the peak value in one peak of a function.

It should be noted that the piezoelectric layer 2037 formed on a plane does not comprise distinctly turning crystals, so that the electro-mechanical coupling factor and Q value of the resonance device are increased.

In this embodiment, the piezoelectric layer 2037 and the passive device 205 are located on two sides of the electrode layer 2039 respectively. In this embodiment, the electrode layer 2039 is made of, but not limited to, at least one of the following materials: molybdenum, ruthenium, tungsten, platinum, iridium, aluminum and beryllium.

In this embodiment, the passive device 205 comprises, but is not limited to, at least one of a capacitor, an inductor, a resistor and a through hole. It should be noted that any passive devices (such as IPDs) known by those skilled in the art can be applied to the embodiment of the invention. In this embodiment, the passive device 205 comprises a cavity 2051 located over the resonance region and corresponding to the cavity 2033a, and the cavity 2051 can optimize the height of the monolithic filter device. In another embodiment, a cavity may be formed over the resonance region by elevating the passive device.

In this embodiment, first terminals of the two connectors 207 are electrically connected to the electrode layer 2035 and the electrode layer 2039 respectively, and second terminals of the two connectors 207 are electrically connected to the passive device 205. In this embodiment, the connectors 207 include, but are not limited to, at least one of an electrical wire, a bump, a pad and a through hole. It should be noted that any connecting structures known by those skilled in the art can be applied to the embodiment of the invention.

In this embodiment, the filter device 200 further comprises a sealing element 209, wherein the sealing element 209 is disposed on the piezoelectric layer 2037 and located between the piezoelectric layer 2037 and the passive device 205, at least encircles the cavity 2051, and is used to seal the cavity 2051.

It should be noted that the filter device formed by integrating the BAW resonance device and the passive device in one die can broaden the passband width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 3:
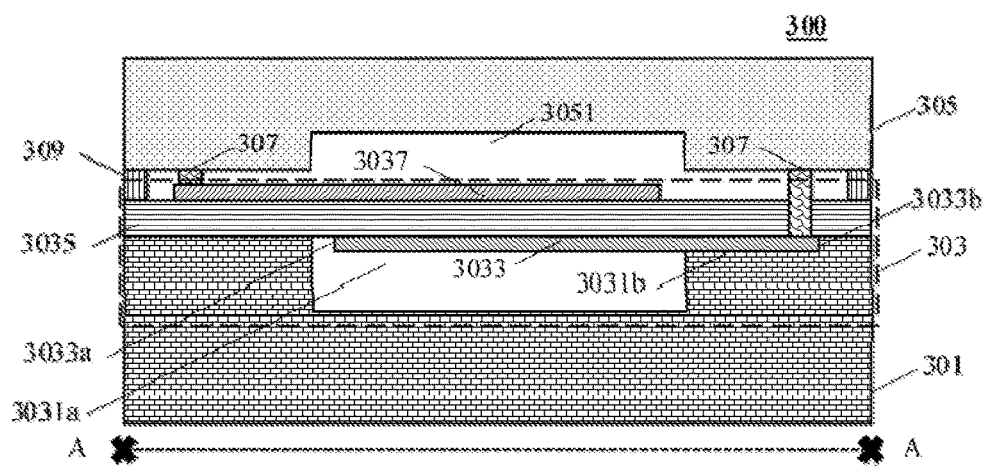
FIG. 3 is a structural diagram of cross-section A of a filter device 300 in an embodiment of the invention.

FIG. 3 is a structural diagram of cross-section A of a filter device 300 in an embodiment of the invention.

As shown in FIG. 3, an embodiment of the invention provides a filter device 300 which comprises a substrate 301, a BAW resonance device 303 and a passive device 305, wherein the substrate 301 is a die substrate, the BAW resonance device 303 is located over the substrate 301, the passive device 305 is located over the BAW resonance device 303, and the BAW resonance device 303 is electrically connected to the passive device 305 through connectors 207.

In this embodiment, the substrate 301 is located on a first side of the BAW resonance device 303, and the passive device 305 is located on a second side of the BAW resonance device 303, wherein the first side and the second side of the BAW resonance device 303 are opposite. In this embodiment, the substrate 301, the BAW resonance device 303 and the passive device 305 are integrated in one die.

In this embodiment, the substrate 301 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the BAW resonance device 303 comprises, but is not limited to, a cavity 3031a, a groove 3031b, an electrode layer 3033, a piezoelectric layer 3035 and an electrode layer 3037, wherein the cavity 3031a and the groove 3031b are formed in the upper surface of the substrate 301, the groove 3031b is located on one of the left and right sides of the cavity 3031a and is communicated with the cavity 3031a, and the depth of the groove 3031b is smaller than that of the cavity 3031a; a first terminal 3033a of the electrode layer 3033 is located in the cavity 3031a, a second terminal 3033b of the electrode layer 3033 is located in the groove 3031b and is opposite to the first terminal 3033a, and the depth of the groove 3031b is equal to the thickness of the electrode layer 3033; the piezoelectric layer 3035 is located on the electrode layer 3033, is a flat layer and at least covers the cavity 3031a; the electrode layer 3037 is located on the piezoelectric layer 3035, and the electrode layer 3033 and the electrode layer 3037 are located on two sides of the piezoelectric layer 3035 respectively; and a resonance region (namely, an overlap region of the electrode layer 3033 and the electrode layer 3037) is suspended with respect to the cavity 3031a and does not overlap with the substrate 301.

In this embodiment, the electrode layer 3033 is made of, but not limited to, at least one of the following materials: molybdenum, ruthenium, tungsten, platinum, iridium, aluminum and beryllium.

In this embodiment, the piezoelectric layer 3035 covers the upper surface of the substrate 301. In this embodiment, the substrate 301 and the passive device 305 are located on two sides of the piezoelectric layer 3035 respectively. In this embodiment, the piezoelectric layer 3035 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the piezoelectric layer 3035 and the passive device 305 are located on two sides of the electrode layer 3037 respectively. In this embodiment, the electrode layer 3037 is made of, but not limited to, at least one of the following materials: molybdenum, ruthenium, tungsten, platinum, iridium, aluminum and beryllium.

In this embodiment, the passive device 305 comprises, but is not limited to, at least one of a capacitor, an inductor, a resistor and a through hole. It should be noted that any passive device (such as IPDs) known by those skilled in the art can be applied to the embodiment of the invention. In this embodiment, the passive device 305 comprises a cavity 3051 located over the resonance region and corresponding to the cavity 3031a, and the cavity 3051 can optimize the height of the monolithic filter device. In another embodiment, a cavity may be formed over the resonance region by elevating the passive device.

In this embodiment, first terminals of the two connectors 307 are electrically connected to the electrode layer 3033 and the electrode layer 3037 respectively, and second terminals of the connectors 307 are electrically connected to the passive device 305. In this embodiment, the connectors 307 include, but are not limited to, at least one of an electrical wire, a bump, a pad and a through hole. It should be noted that any connecting structures known by those skilled in the art can be applied to the embodiment of the invention.

In this embodiment, the filter device 300 further comprises a sealing element 309, wherein the sealing element 309 is disposed on the piezoelectric layer 3035 and located between the piezoelectric layer 3035 and the passive device 305, at least encircles the cavity 3051, and is used to seal the cavity 3051.

It should be noted that the filter device formed by integrating the BAW resonance device and the passive device in one die can broaden the passband width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 4:
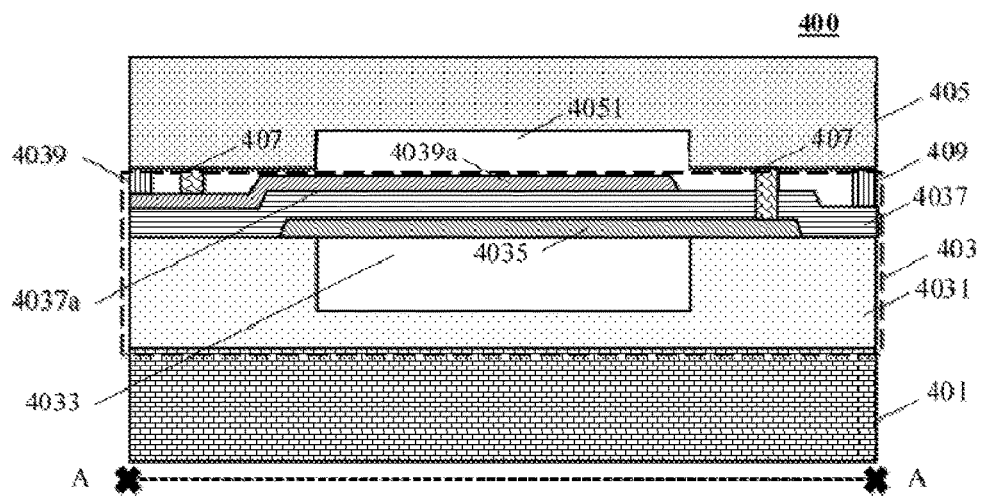
FIG. 4 is a structural diagram of cross-section A of a filter device 400 in an embodiment of the invention.

FIG. 4 is a structural diagram of cross-section A of a filter device 400 in an embodiment of the invention.

As shown in FIG. 4, an embodiment of the invention provides a filter device 400 which comprises a substrate 401, a BAW resonance device 403 and a passive device 405, wherein the substrate 401 is a die substrate, the BAW resonance device 403 is located over the substrate 401, the passive device 405 is located over the BAW resonance device 403, and the BAW resonance device 403 is electrically connected to the passive device 405 through connectors 407.

In this embodiment, the substrate 401 and the passive device 405 are located on two sides of the BAW resonance device 403 respectively. In this embodiment, the substrate 401, the BAW resonance device 403 and the passive device 405 are integrated in one die.

In this embodiment, the substrate 401 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the BAW resonance device 403 comprises an intermediate layer 4031, an electrode layer 4035, a piezoelectric layer 4037 and an electrode layer 4039, wherein the intermediate layer 4031 is located on the substrate 401, and a cavity 4033 is formed in the upper surface of the intermediate layer 4031; the electrode layer 4035 is located over the cavity 4033 and covers the cavity 4033, and the substrate 401 and the electrode layer 4035 are located on two sides of the intermediate layer 4031 respectively; the piezoelectric layer 4037 is located on the intermediate layer 4031, covers the electrode layer 4035 and comprises a protruding part 4037*a* located over the electrode layer 4035; the electrode layer 4039 is located on the piezoelectric layer 4037 and comprises a protruding part 4039*a* located on the protruding part 4037*a*; and a resonance region (namely, an overlap region of the electrode layer 4035 and the electrode layer 4039) overlaps with the intermediate layer 4031, and an overlap part is located on one of the left and right sides of the cavity 4033.

In this embodiment, the intermediate layer 4031 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the electrode layer 4035 is located on the intermediate layer 4031. In this embodiment, cross-section A of the electrode layer 4035 is trapezoidal. In another embodiment, cross-section A of the lower electrode layer is rectangular. In this embodiment, the electrode layer 4035 is made of, but not limited to, at least one of the following materials: molybdenum, ruthenium, tungsten, platinum, iridium, aluminum and beryllium.

In this embodiment, the piezoelectric layer 4037 covers the upper surface of the intermediate layer 4031. In this embodiment, the piezoelectric layer 4037 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate. It should be noted that the acoustic impedance of the material of the intermediate layer 4031 is different from that of the material of the piezoelectric layer 4037, so that leaky waves in a lateral mode can be blocked.

In this embodiment, the protruding height of the protruding part 4037*a* is greater than or equal to the thickness of the electrode layer 4035. In this embodiment, cross-section A of the protruding part 4037*a* is trapezoidal. In another embodiment, cross-section A of the first protruding part is rectangular.

In this embodiment, the piezoelectric layer 4037 and the passive device 405 are located on two sides of the electrode layer 4039 respectively. In this embodiment, the electrode layer 4039 is made of, but not limited to, at least one of the following materials: molybdenum, ruthenium, tungsten, platinum, iridium, aluminum and beryllium.

In this embodiment, the protruding height of the protruding part 4039*a* is greater than or equal to the thickness of the electrode layer 4035. In this embodiment, cross-section A of the protruding part 4039*a* is trapezoidal. In another embodiment, cross-section A of the second protruding part is rectangular.

In this embodiment, the passive device 405 comprises, but is not limited to, at least one of a capacitor, an inductor, a resistor and a through hole. It should be noted that any passive devices (such as IPDs) known by those skilled in the art can be applied to the embodiments of the invention. In this embodiment, the passive device 405 comprises a cavity 4051 located over the resonance region and corresponding to the cavity 4033, and the cavity 4051 can optimize the height of the monolithic filter device. In another embodiment, a cavity may be formed over the resonance region by elevating the passive device.

In this embodiment, first terminals of the two connectors 407 are electrically connected to the electrode layer 4035 and the electrode layer 4039 respectively, and second terminals of the connectors 407 are electrically connected to the passive device 405. In this embodiment, the connectors 407 include, but are not limited to, at least one of an electrical wire, a bump, a pad and a through hole. It should be noted that any connecting structures known by those skilled in the art can be applied to the embodiment of the invention.

In this embodiment, the filter device 400 further comprises a sealing element 409, wherein the sealing element 409 is located between the BAW resonance device 403 and the passive device 405, at least encircles the cavity 4051, and is used to seal the cavity 4051.

It should be noted that the filter device formed by integrating the BAW resonance device and the passive device in one die can broaden the passband width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 5:
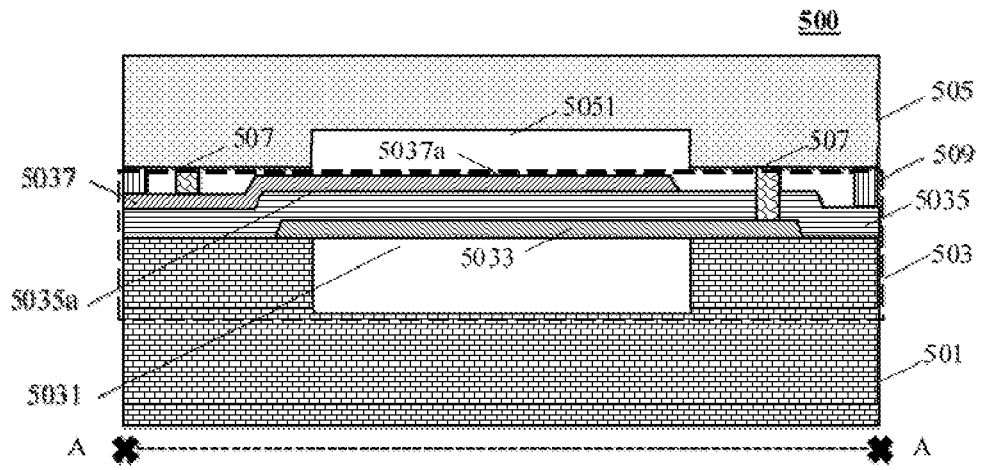
FIG. 5 is a structural diagram of cross-section A of a filter device 500 in an embodiment of the invention.

FIG. 5 is a structural diagram of cross-section A of a filter device 500 in an embodiment of the invention.

As shown in FIG. 5, an embodiment of the invention provides a filter device 500 which comprises a substrate 501, a BAW resonance device 503 and a passive device 505, wherein the substrate 501 is a die substrate, the BAW resonance device 503 is located over the substrate 501, the passive device 505 is located over the BAW resonance device 503, and the BAW resonance device 503 is electrically connected to the passive device 505 through connectors 507.

In this embodiment, the substrate 501 is located on a first side of the BAW resonance device 503, and the passive device 505 is located on a second side of the BAW resonance device 503, wherein the first side and the second side of the BAW resonance device 503 are opposite. In this embodiment, the substrate 501, the BAW resonance device 503 and the passive device 505 are integrated in one die.

In this embodiment, the substrate 501 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the BAW resonance device 503 comprises, but is not limited to, a cavity 5031, an electrode layer 5033, a piezoelectric layer 5035 and an electrode layer 5037, wherein the cavity 5031 is formed in the upper surface of the substrate 501; the electrode layer 5033 is located over the cavity 5031 and covers the cavity 5031; the piezoelectric layer 5035 is located on the substrate 501, covers the electrode layer 5033 and comprises a protruding part 5035a located over the electrode layer 5033; the electrode layer 5037 is located on the piezoelectric layer 5035 and comprises a protruding part 5037a located on the protruding part 5035a; and a resonance region (namely, an overlap region of the electrode layer 5033 and the electrode layer 5037) overlaps with the substrate 501, and an overlap part is located on one of the left and right sides of the cavity 5031.

In this embodiment, the electrode layer 5033 is located on the substrate 501. In this embodiment, cross-section A of the electrode layer 5033 is trapezoidal. In another embodiment, cross-section A of the lower electrode layer is rectangular. In this embodiment, the electrode layer 5033 is made of, but not limited to, at least one of the following materials: molybdenum, ruthenium, tungsten, platinum, iridium, aluminum and beryllium.

In this embodiment, the piezoelectric layer 5035 covers the upper surface of the substrate 501. In this embodiment, the piezoelectric layer 5035 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the protruding height of the protruding part 5035a is greater than or equal to the thickness of the electrode layer 5033. In this embodiment, cross-section A of the protruding part 5035a is trapezoidal. In another embodiment, cross-section A of the first protruding part is rectangular.

In this embodiment, the piezoelectric layer 5035 and the passive device 505 are located on two sides of the electrode layer 5037 respectively. In this embodiment, the electrode layer 5037 is made of, but not limited to, at least one of the following materials: molybdenum, ruthenium, tungsten, platinum, iridium, aluminum and beryllium.

In this embodiment, the protruding height of the protruding part 5037a is greater than or equal to the thickness of the electrode layer 5033. In this embodiment, cross-section A of the protruding part 5037a is trapezoidal. In another embodiment, cross-section A of the second protruding part is rectangular.

In this embodiment, the passive device 505 comprises, but is not limited to, at least one of a capacitor, an inductor, a resistor and a through hole. It should be noted that any passive devices (such as IPDs) known by those skilled in the art can be applied to the embodiments of the invention. In this embodiment, the passive device 505 comprises a cavity 5051 located over the resonance region and corresponding to the cavity 5031, and the cavity 5051 can optimize the height of the monolithic filter device. In another embodiment, a cavity may be formed over the resonance region by elevating the passive device.

In this embodiment, first terminals of the two connectors 507 are electrically connected to the electrode layer 5033 and the electrode layer 5037 respectively, and second terminals of the connectors 507 are electrically connected to the passive device 505. In this embodiment, the connectors 507 include, but are not limited to, at least one of an electrical wire, a bump, a pad and a through hole. It should be noted that any connecting structures known by those skilled in the art can be applied to the embodiment of the invention.

In this embodiment, the filter device 500 further comprises a sealing element 509, wherein the sealing element 509 is located between the BAW resonance device 503 and the passive device 505, at least encircles the cavity 5051 and is used to seal the cavity 5051.

It should be noted that the filter device formed by integrating the BAW resonance device and the passive device in one die can broaden the passband width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 6:
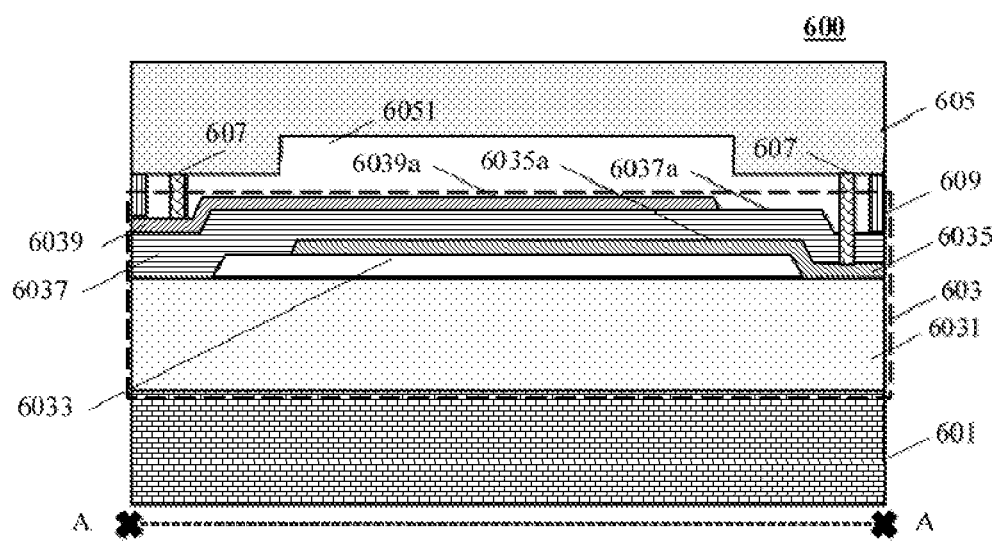
FIG. 6 is a structural diagram of cross-section A of a filter device 600 in an embodiment of the invention.

FIG. 6 is a structural diagram of cross-section A of a filter device 600 in an embodiment of the invention.

As shown in FIG. 6, an embodiment of the invention provides a filter device 600 which comprises a substrate 601, a BAW resonance device 603 and a passive device 605, wherein the substrate 601 is a die substrate, the BAW resonance device 603 is located over the substrate 601, the passive device 605 is located over the BAW resonance device 603, and the BAW resonance device 603 is electrically connected to the passive device 605 through connectors 607.

In this embodiment, the substrate 601 and the passive device 605 are located on two sides of the BAW resonance device 603 respectively. In this embodiment, the substrate 601, the BAW resonance device 603 and the passive device 605 are located in one die.

In this embodiment, the substrate 601 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the BAW resonance device 603 comprises an intermediate layer 6031, a reflection layer 6033, an electrode layer 6035, a piezoelectric layer 6037 and an electrode layer 6039, wherein the intermediate layer 6031 is located on the substrate 601; the reflection layer 6033 is located on the intermediate layer 6031, and the substrate 601 and the reflection layer 6033 are located on two sides of the intermediate layer 6031 respectively; the electrode layer 6035 is located on the intermediate layer 6031 and comprises a protruding part 6035a located on the reflection layer 6033; the piezoelectric layer 6037 is located on the intermediate layer 6031 and comprises a protruding part 6037a located over the protruding part 6035a; the electrode layer 6039 is located on the piezoelectric layer 6037 and comprises a protruding part 6039a located on the protruding part 6037a; and a resonance region (namely, an overlap region of the electrode layer 6035 and the electrode layer 6039) is located over the reflection layer 6033.

In this embodiment, the intermediate layer 6031 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, cross-section A of the reflection layer 6033 is trapezoidal. In another embodiment, cross-section A of the reflection layer is rectangular. In this embodiment, the reflection layer 6033 is a cavity, namely cavity 6033.

In this embodiment, the electrode layer 6035 is made of, but not limited to, at least one of the following materials: molybdenum, ruthenium, tungsten, platinum, iridium, aluminum and beryllium. In this embodiment, the protruding height of the protruding part 6035a is greater than or equal to the thickness of the reflection layer 6033 (namely, the depth of the cavity 6033). In this embodiment, cross-section A of the protruding part 6035a is trapezoidal. In another embodiment, cross-section A of the first protruding part is rectangular.

In this embodiment, the piezoelectric layer 6037 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate. It should be noted that the acoustic resistance of the material of the intermediate layer 6031 is different from that of the material of the piezoelectric layer 6037, so that leaky waves in a lateral mode can be blocked.

In this embodiment, the protruding height of the protruding part 6037a is greater than or equal to the thickness of the reflection layer 6033 (namely, the depth of the cavity 6033). In this embodiment, cross-section A of the protruding part 6037a is trapezoidal. In another embodiment, cross-section A of the second protruding part is rectangular.

In this embodiment, the electrode layer 6039 is made of, but not limited to, at least one of the following materials: molybdenum, ruthenium, tungsten, platinum, iridium, aluminum and beryllium. In this embodiment, the protruding height of the protruding part 6039a is greater than or equal to the thickness of the reflection layer 6033 (namely, the depth of the cavity 6033). In this embodiment, cross-section A of the protruding part 6039a is trapezoidal. In another embodiment, cross-section A of the third protruding part is rectangular.

In this embodiment, the passive device 605 comprises, but is not limited to, at least one of a capacitor, an inductor, a resistor and a through hole. It should be noted that any passive devices (such as IPDs) known by those skilled in the art can be applied to the embodiment of the invention. In this embodiment, the passive device 605 comprises a cavity 6051 located over the resonance region and corresponding to the cavity 6033, and the cavity 6051 can optimize the height of the monolithic filter device. In another embodiment, a cavity may be formed over the resonance region by elevating the passive device.

In this embodiment, first terminals of the two connectors 607 are electrically connected to the electrode layer 6035 and the electrode layer 6039 respectively, and second terminals of the connectors 607 are electrically connected to the passive device 605. In this embodiment, the connectors 607 include, but are not limited to, at least one of an electrical wire, a bump, a pad and a through hole. It should be noted that any connecting structures known by those skilled in the art can be applied to the embodiment of the invention.

In this embodiment, the filter device 600 further comprises a sealing element 609, wherein the sealing element 609 is located between the BAW resonance device 603 and the passive device 605, at least encircles the cavity 6051 and is used to seal the cavity 6051.

It should be noted that the filter device formed by integrating the BAW resonance device and the passive device in one die can broaden the passband width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 7:
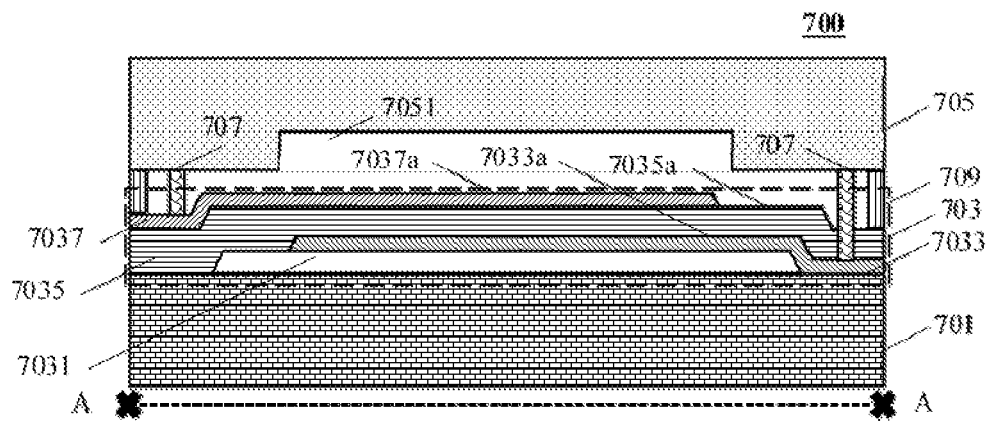
FIG. 7 is a structural diagram of cross-section A of a filter device 700 in an embodiment of the invention.

FIG. 7 is a structural diagram of cross-section A of a filter device 700 in an embodiment of the invention.

As shown in FIG. 7, an embodiment of the invention provides a filter device 700 which comprises a substrate 701, a BAW resonance device 703 and a passive device 705, wherein the substrate 701 is a die substrate, the BAW resonance device 703 is located on the substrate 701, the passive device 705 is located over the BAW resonance device 703, and the BAW resonance device 703 is electrically connected to the passive device 705 through connectors 707.

In this embodiment, the substrate 701 is located on a first side of the BAW resonance device 703, and the passive device 705 is located on a second side of the BAW resonance device 703, wherein the first side and the second side of the BAW resonance device 703 are opposite. In this embodiment, the substrate 701, the BAW resonance device 703 and the passive device 705 are located in one die.

In this embodiment, the substrate 701 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the BAW resonance device 703 comprises a reflection layer 7031, an electrode layer 7033, a piezoelectric layer 7035 and an electrode layer 7037, wherein the reflection layer 7031 is located on the substrate 701; the electrode layer 7033 is located on the substrate 701 and comprises a protruding part 7033a located on the reflection layer 7031; the piezoelectric layer 7035 is located on the substrate 701 and comprises a protruding part 7035a located over the protruding part 7033a; the electrode layer 7037 is located on the piezoelectric layer 7035 and comprises a protruding part 7037a located on the protruding part 7035a; and a resonance region (namely, an overlap region of the electrode layer 7033 and the electrode layer 7037) is located over the reflection layer 7031.

In this embodiment, cross-section A of the reflection layer 7031 is trapezoidal. In another embodiment, cross-section A of the reflection layer is rectangular. In this embodiment, the reflection layer 7031 is a cavity, namely cavity 7031.

In this embodiment, the electrode layer 7033 is made of, but not limited to, at least one of the following materials: molybdenum, ruthenium, tungsten, platinum, iridium, aluminum and beryllium. In this embodiment, the protruding height of the protruding part 7033a is greater than or equal to the thickness of the reflection layer 7031 (namely, the depth of the cavity 7031). In this embodiment, cross-section A of the protruding part 7033a is trapezoidal. In another embodiment, cross-section A of the first protruding part is rectangular.

In this embodiment, the piezoelectric layer 7035 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the protruding height of the protruding part 7035a is greater than or equal to the thickness of the reflection layer 7031 (namely, the depth of the cavity 7031). In this embodiment, cross-section A of the protruding part 7035a is trapezoidal. In another embodiment, cross-section A of the second protruding part is rectangular.

In this embodiment, the electrode layer 7037 is made of, but not limited to, at least one of the following materials: molybdenum, ruthenium, tungsten, platinum, iridium, aluminum and beryllium. In this embodiment, the protruding height of the protruding part 7037a is greater than or equal to the thickness of the reflection layer 7031 (namely, the depth of the cavity 7031). In this embodiment, cross-section A of the protruding part 7037a is trapezoidal. In another embodiment, cross-section A of the third protruding part is rectangular.

In this embodiment, the passive device 705 comprises, but is not limited to, at least one of a capacitor, an inductor, a resistor and a through hole. It should be noted that any passive devices (such as IPDs) known by those skilled in the art can be applied to the embodiment of the invention. In this embodiment, the passive device 705 comprises a cavity 7051 located over the resonance region and corresponding to the cavity 7031, and the cavity 7051 can optimize the height of the monolithic filter device. In another embodiment, a cavity may be formed over the resonance region by elevating the passive device.

In this embodiment, first terminals of the two connectors 707 are electrically connected to the electrode layer 7033 and the electrode layer 7037 respectively, and second terminals of the connectors 707 are electrically connected to the passive device 705. In this embodiment, the connectors 707 include, but are not limited to, at least one of an electrical wire, a bump, a pad and a through hole. It should be noted that any connecting structures known by those skilled in the art can be applied to the embodiment of the invention.

In this embodiment, the filter device 700 further comprises a sealing element 709, wherein the sealing element 709 is located between the BAW resonance device 703 and the passive device 705, at least encircles the cavity 7051 and is used to seal the cavity 7051.

It should be noted that the filter device formed by integrating the BAW resonance device and the passive device in one die can broaden the passband width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 8:
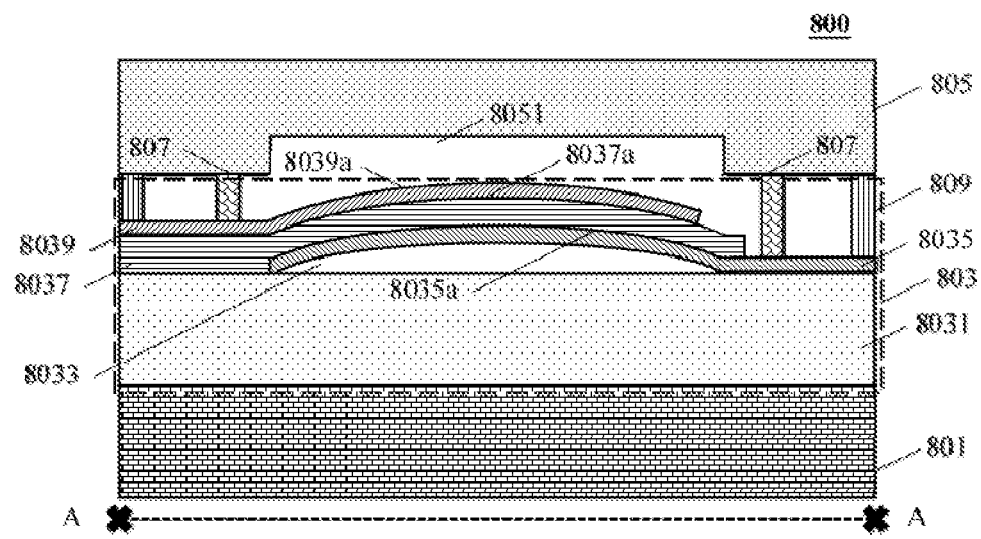
FIG. 8 is a structural diagram of cross-section A of a filter device 800 in an embodiment of the invention.

FIG. 8 is a structural diagram of cross-section A of a filter device 800 in an embodiment of the invention.

As shown in FIG. 8, an embodiment of the invention provides a filter device 800 which comprises a substrate 801, a BAW resonance device 803 and a passive device 805, wherein the substrate 801 is a die substrate, the BAW resonance device 803 is located over the substrate 801, the passive device 805 is located over the BAW resonance device 803, and the BAW resonance device 803 is electrically connected to the passive device 805 through connectors 807.

In this embodiment, the substrate 801 and the passive device 805 are located on two sides of the BAW resonance device 803 respectively. In this embodiment, the substrate 801, the BAW resonance device 803 and the passive device 805 are located in one die.

In this embodiment, the substrate 801 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the BAW resonance device 803 comprises an intermediate layer 8031, a reflection layer 8033, an electrode layer 8035, a piezoelectric layer 8037 and an electrode layer 8039, wherein the intermediate layer 8031 is located on the substrate 801; the reflection layer 8033 is located on the intermediate layer 8031, and the substrate 801 and the reflection layer 8033 are located on two sides of the intermediate layer 8031 respectively; the electrode layer 8035 is located on the intermediate layer 8031 and comprises a protruding part 8035a located on the reflection layer 8033; the piezoelectric layer 8037 is located on the intermediate layer 8031 and comprises a protruding part 8037a located over the protruding part 8035a; the electrode layer 8039 is located on the piezoelectric layer 8037 and comprises a protruding part 8039a located on the protruding part 8037a; and a resonance region (namely, an overlap region of the electrode layer 8035 and the electrode layer 8039) is located over the reflection layer 8033.

In this embodiment, the intermediate layer 8031 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, cross-section A of the reflection layer 8033 is arched. In this embodiment, the reflection layer 8033 is a cavity, namely cavity 8033.

In this embodiment, the electrode layer 8035 is made of, but not limited to, at least one of the following materials: molybdenum, ruthenium, tungsten, platinum, iridium, aluminum and beryllium. In this embodiment, the protruding height of the protruding part 8035a is greater than or equal to the thickness of the reflection layer 8033 (namely, the depth of the cavity 8033). In this embodiment, cross-section A of the protruding part 8035a is arched.

In this embodiment, the piezoelectric layer 8037 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate. It should be noted that the acoustic resistance of the material of the intermediate layer 8031 is different from that of the material of the piezoelectric layer 8037, so that leaky waves in a lateral mode can be blocked.

In this embodiment, the protruding height of the protruding part 8037a is greater than or equal to the thickness of the reflection layer 8033 (namely, the depth of the cavity 8033). In this embodiment, cross-section A of the protruding part 8037a is arched.

In this embodiment, the electrode layer 8039 is made of, but not limited to, at least one of the following materials: molybdenum, ruthenium, tungsten, platinum, iridium, aluminum and beryllium. In this embodiment, the protruding height of the protruding part 8039a is greater than or equal to the thickness of the reflection layer 8033 (namely, the depth of the cavity 8033). In this embodiment, cross-section A of the protruding part 8039 is trapezoidal.

In this embodiment, the passive device 805 comprises, but is not limited to, at least one of a capacitor, an inductor, a resistor and a through hole. It should be noted that any passive devices (such as IPDs) known by those skilled in the art can be applied to the embodiment of the invention. In this embodiment, the passive device 805 comprises a cavity 8051 located over the resonance region and corresponding to the cavity 8033, and the cavity 8051 can optimize the height of the monolithic filter device. In another embodiment, a cavity may be formed over the resonance region by elevating the passive device.

In this embodiment, first terminals of the two connectors 807 are electrically connected to the electrode layer 8035 and the electrode layer 8039 respectively, and second terminals of the connectors 807 are electrically connected to the passive device 805. In this embodiment, the connectors 807 include, but are not limited to, at least one of an electrical wire, a bump, a pad and a through hole. It should be noted that any connecting structures known by those skilled in the art can be applied to the embodiment of the invention.

In this embodiment, the filter device 800 further comprises a sealing element 809, wherein the sealing element 809 is located between the BAW resonance device 803 and the passive device 805, at least encircles the cavity 8051 and is used to seal the cavity 8051.

It should be noted that the filter device formed by integrating the BAW resonance device and the passive device in one die can broaden the passband width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 9:
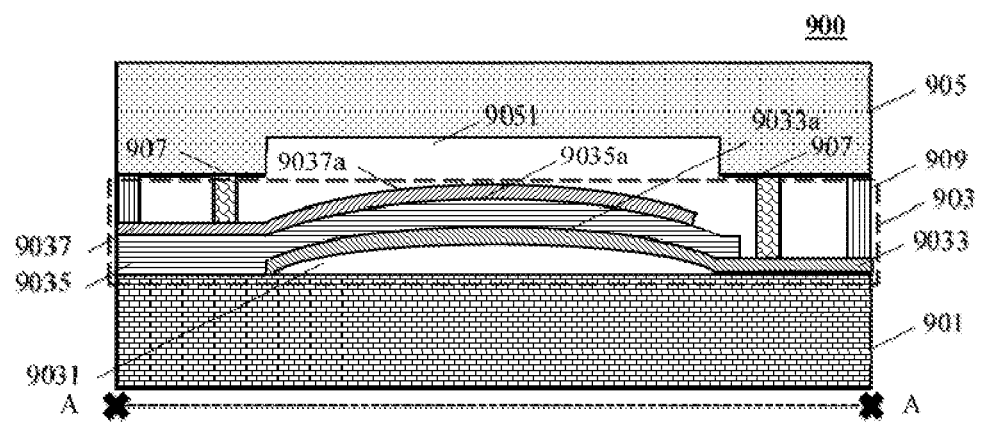
FIG. 9 is a structural diagram of cross-section A of a filter device 900 in an embodiment of the invention.

FIG. 9 is a structural diagram of cross-section A of a filter device 900 in an embodiment of the invention.

As shown in FIG. 9, an embodiment of the invention provides a filter device 900 which comprises a substrate 901, a BAW resonance device 903 and a passive device 905, wherein the substrate 901 is a die substrate, the BAW resonance device 903 is located on the substrate 901, the passive device 905 is located over the BAW resonance device 903, and the BAW resonance device 903 is electrically connected to the passive device 905 through connectors 907.

In this embodiment, the substrate 901 is located on a first side of the BAW resonance device 903, and the passive device 905 is located on a second side of the BAW resonance device 903, wherein the first side and the second side of the BAW resonance device 903 are opposite. In this embodiment, the substrate 901, the BAW resonance device 903 and the passive device 905 are located in one die.

In this embodiment, the substrate 901 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the BAW resonance device 903 comprises a reflection layer 9031, an electrode layer 9033, a piezoelectric layer 9035 and an electrode layer 9037, wherein the reflection layer 9031 is located on the substrate 901; the electrode layer 9033 is located on the substrate 901 and comprises a protruding part 9033a located on the reflection layer 9031; the piezoelectric layer 9035 is located on the substrate 901 and comprises a protruding part 9035a located over the protruding part 9033a; the electrode layer 9037 is located on the piezoelectric layer 9035 and comprises a protruding part 9037a located on the protruding part 9035a; and a resonance region (namely, an overlap region of the electrode layer 9033 and the electrode layer 9037) is located over the reflection layer 9031.

In this embodiment, cross-section A of the reflection layer 9031 is arched. In this embodiment, the reflection layer 9031 is a cavity, namely cavity 9031.

In this embodiment, the electrode layer 9033 is made of, but not limited to, at least one of the following materials: molybdenum, ruthenium, tungsten, platinum, iridium, aluminum and beryllium. In this embodiment, the protruding height of the protruding part 9033a is greater than or equal to the thickness of the reflection layer 9031 (namely, the depth of the cavity 9031). In this embodiment, cross-section A of the protruding part 9033a is arched.

In this embodiment, the piezoelectric layer 9035 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the protruding height of the protruding part 9035a is greater than or equal to the thickness of the reflection layer 9031 (namely, the depth of the cavity 9031). In this embodiment, cross-section A of the protruding part 9035a is arched.

In this embodiment, the electrode layer 9037 is made of, but not limited to, at least one of the following materials: molybdenum, ruthenium, tungsten, platinum, iridium, aluminum and beryllium. In this embodiment, the protruding height of the protruding part 9037a is greater than or equal to the thickness of the reflection layer 9031 (namely, the depth of the cavity 9031). In this embodiment, cross-section A of the protruding part 9037a is arched.

In this embodiment, the passive device 905 comprises, but is not limited to, at least one of a capacitor, an inductor, a resistor and a through hole. It should be noted that any passive devices (such as IPDs) known by those skilled in the art can be applied to the embodiment of the invention. In this embodiment, the passive device 905 comprises a cavity 9051 located over the resonance region and corresponding to the cavity 9031, and the cavity 9051 can optimize the height of the monolithic filter device. In another embodiment, a cavity may be formed over the resonance region by elevating the passive device.

In this embodiment, first terminals of the two connectors 907 are electrically connected to the electrode layer 9033 and the electrode layer 9037 respectively, and second terminals of the connectors 907 are electrically connected to the passive device 905. In this embodiment, the connectors 907 include, but are not limited to, at least one of an electrical wire, a bump, a pad and a through hole. It should be noted that any connecting structures known by those skilled in the art can be applied to the embodiment of the invention.

In this embodiment, the filter device 900 further comprises a sealing element 909, wherein the sealing element 909 is located between the BAW resonance device 903 and the passive device 905, at least encircles the cavity 9051 and is used to seal the cavity 9051.

It should be noted that the filter device formed by integrating the BAW resonance device and the passive device in one die can broaden the passband width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 10:
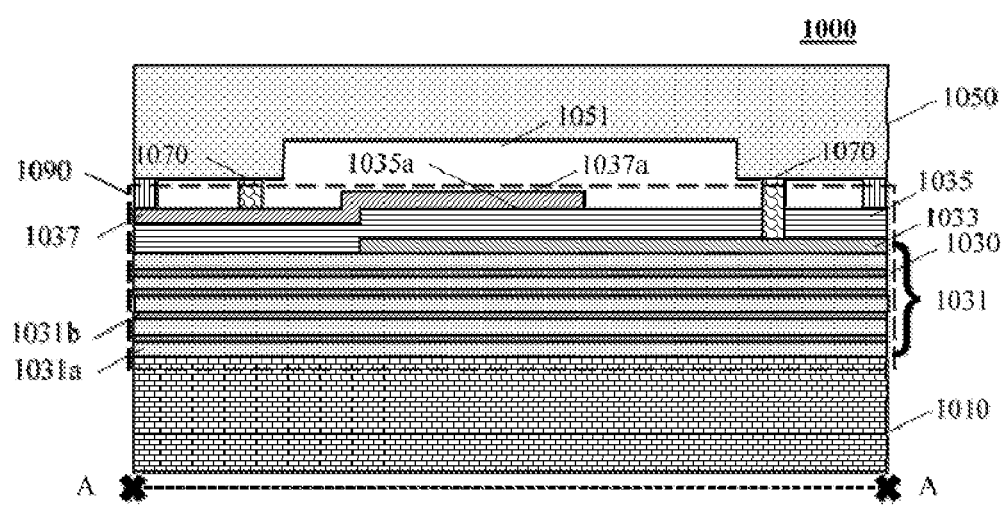
FIG. 10 is a structural diagram of cross-section A of a filter device 1000 in an embodiment of the invention.

FIG. 10 is a structural diagram of cross-section A of a filter device 1000 in an embodiment of the invention.

As shown in FIG. 10, an embodiment of the invention provides a filter device 1000 which comprises a substrate 1010, a BAW resonance device 1030 and a passive device 1050, wherein the substrate 1010 is a die substrate, the BAW resonance device 1030 is located over the substrate 1010, the passive device 1050 is located over the BAW resonance device 1030, and the BAW resonance device 1030 is electrically connected to the passive device 1050 through connectors 1070.

In this embodiment, the substrate 1010 and the passive device 1050 are located on two sides of the BAW resonance device 1030 respectively. In this embodiment, the substrate 1010, the BAW resonance device 1030 and the passive device 1050 are located in one die.

In this embodiment, the substrate 1010 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the BAW resonance device 1030 comprises a reflection layer 1031, an electrode layer 1033, a piezoelectric layer 1035 and an electrode layer 1037, wherein the reflection layer 1031 is located on the substrate 1010; the electrode layer 1033 is located on the reflection layer 1031, and the substrate 1010 and the electrode layer 1033 are located on two sides of the reflection layer 1031 respectively; the piezoelectric layer 1035 is located on the reflection layer 1031, covers the electrode layer 1033 and comprises a protruding part 1035a located over the electrode layer 1033; the electrode layer 1037 is located on the piezoelectric layer 1035 and comprises a protruding part 1037a located on the protruding part 1035a; and a resonance region (namely, an overlap region of the electrode layer 1033 and the electrode layer 1037) is located over the reflection layer 1031.

In this embodiment, the reflection layer 1031 comprises multiple sub-reflection layers 1031a and multiple sub-reflection layers 1031b, wherein the sub-reflection layers 1031a and the sub-reflection layers 1031b are disposed alternately.

In this embodiment, the sub-reflection layers 1031a and the sub-reflection layers 1031b are made of different materials, so that the acoustic impedance of the sub-reflection layers 1031a is different from that of the sub-reflection layers 1031b. In this embodiment, the sub-reflection layers 1031a are made of, but not limited to, at least one of the following materials: silicon oxycarbide, silicon nitride, silicon dioxide, aluminum nitride, tungsten and molybdenum. In this embodiment, the sub-reflection layers 1031b are made of, but not limited to, at least one of the following materials: silicon oxycarbide, silicon nitride, silicon dioxide, aluminum nitride, tungsten and molybdenum.

In this embodiment, the reflection layer 1031 is a quarter-wave Bragg mirror. In this embodiment, the thickness of the sub-reflection layers 1031a is twice that of the sub-reflection layers 1031b. In another embodiment, the sub-reflection layers have the same thickness. It should be noted that the quarter-wave Bragg mirror in this embodiment is merely a specific example which is not intended to limit the invention, and all other acoustic reflection layers known by those skilled in the art can be applied to the embodiment of the invention.

In this embodiment, the electrode layer 1033 is made of, but not limited to, at least one of the following materials: molybdenum, ruthenium, tungsten, platinum, iridium, aluminum and beryllium.

In this embodiment, the piezoelectric layer 1035 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate. In this embodiment, the height of the protruding part 1035a is greater than or equal to the thickness of the electrode layer 1033. In this embodiment, cross-section A of the protruding part 1035a is rectangular. In another embodiment, cross-section A of the first protruding part is trapezoidal.

In this embodiment, the electrode layer 1037 is made of, but not limited to, at least one of the following materials: molybdenum, ruthenium, tungsten, platinum, iridium, aluminum and beryllium. In this embodiment, the protruding height of the protruding part 1037a is greater than or equal to the thickness of the electrode layer 1033. In this embodiment, cross-section A of the protruding part 1037a is rectangular. In another embodiment, cross-section A of the second protruding part is trapezoidal.

In this embodiment, the passive device 1050 comprises, but is not limited to, at least one of a capacitor, an inductor, a resistor and a through hole. It should be noted that any passive devices (such as IPDs) known by those skilled in the art can be applied to the embodiments of the invention. In this embodiment, the passive device 1050 comprises a cavity 1051 located over the resonance region, and the cavity 1051 can optimize the height of the monolithic filter device. In another embodiment, a cavity may be formed over the resonance region by elevating the passive device.

In this embodiment, first terminals of the two connectors 1070 are electrically connected to the electrode layer 1033 and the electrode layer 1037 respectively, and second terminals of the connectors 1070 are electrically connected to the passive device 1050. In this embodiment, the connectors 1070 include, but are not limited to, at least one of an electrical wire, a bump, a pad and a through hole. It should be noted that any connecting structures known by those skilled in the art can be applied to the embodiment of the invention.

In this embodiment, the filter device 1000 further comprises a sealing element 1090, wherein the sealing element 1090 is located between the BAW resonance device 1030 and the passive device 1050, at least encircles the cavity 1051 and is used to seal the cavity 1051.

It should be noted that the filter device formed by integrating the BAW resonance device and the passive device in one die can broaden the passband width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 11:
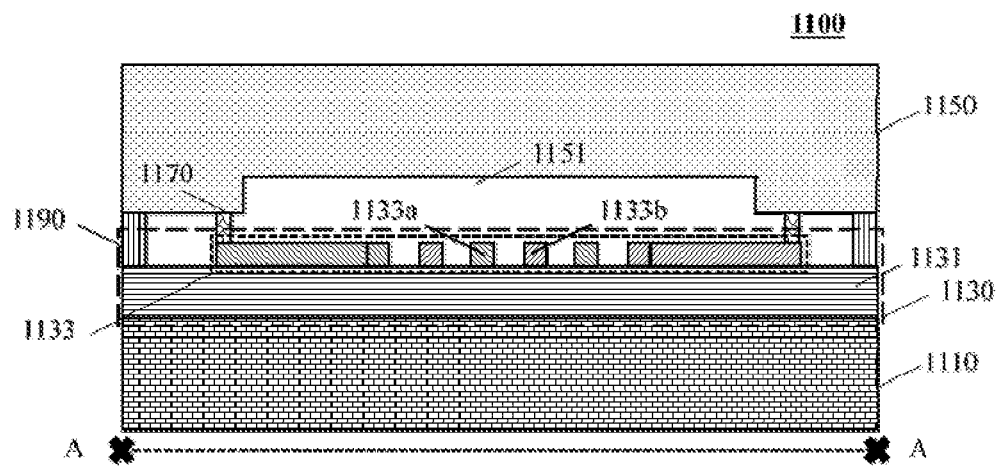
FIG. 11 is a structural diagram of cross-section A of a filter device 1100 in an embodiment of the invention.

FIG. 11 is a structural diagram of cross-section A of a filter device 1100 in an embodiment of the invention.

As shown in FIG. 11, an embodiment of the invention provides a filter device 1100 which comprises a substrate 1110, an SAW resonance device 1130 and a passive device 1150, wherein the substrate 1110 is a die substrate, the SAW resonance device 1130 is located over the substrate 1110, the passive device 1150 is located over the SAW resonance device 1130, and the SAW resonance device 1130 is electrically connected to the passive device 1150 through connectors 1170.

In this embodiment, the substrate 1110 is located on a first side of the SAW resonance device 1130, and the passive device 1150 is located on a second side of the SAW resonance device 1130, wherein the first side and the second side of the SAW resonance device 1130 are opposite. In this embodiment, the substrate 1110, the BAW resonance device 1130 and the passive device 1150 are located in one die.

In this embodiment, the substrate 1110 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the SAW resonance device 1130 comprises a piezoelectric layer 1131 and an electrode layer 1133, wherein the piezoelectric layer 1131 is located on the substrate 1110, the electrode layer 1133 is located on the piezoelectric layer 1131, and the piezoelectric layer 1131 and the passive device 1150 are located on two sides of the electrode layer 1133 respectively.

In this embodiment, the piezoelectric layer 1131 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the electrode layer 1133 comprises an interdigital transducer (IDT), wherein the IDT comprises multiple electrode bars 1133*a* and multiple electrode bars 1133*b*.

In this embodiment, the polarity of the multiple electrode bars 1133*a* is different from that of the multiple electrode bars 1133*b*. In this embodiment, the electrode bars 1133*a* and the electrode bars 1133*b* are disposed alternately. In this embodiment, the distances between the electrode bars 1133*a* and the adjacent electrode bars 1133*b* are equal. In another embodiment, the distances between every two of the adjacent electrode bars are different.

It should be noted that any IDT structures known by those skilled in the art can be applied to the embodiment of the invention.

In this embodiment, the passive device 1150 comprises, but is not limited to, at least one of a capacitor, an inductor, a resistor and a through hole. It should be noted that any passive devices (such as IPDs) known by those skilled in the art can be applied to the embodiment of the invention. In this embodiment, the passive device 1150 comprises a cavity 1151 located over the electrode layer 1133, and the cavity 1151 can optimize the height of the monolithic filter device. In another embodiment, a cavity may be formed over the resonance region by elevating the passive device.

In this embodiment, first terminals of the two connectors 1170 are electrically connected to the multiple electrode bars 1133*a* and the multiple electrode bars 1133*b* respectively, and second terminals of the connectors 1170 are electrically connected to the passive device 1050. In this embodiment, the connectors 1170 include, but are not limited to, at least one of an electrical wire, a bump, a pad and a through hole. It should be noted that any connecting structures known by those skilled in the art can be applied to the embodiment of the invention.

In this embodiment, the filter device 1100 further comprises a sealing element 1190, wherein the sealing element 1190 is disposed on the piezoelectric layer 1131 and located between the piezoelectric layer 1131 and the passive device 1150, at least encircles the cavity 1151 and is used to seal the cavity 1151.

It should be noted that the filter device formed by integrating the SAW resonance device and the passive device in one die can broaden the passband width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 12:
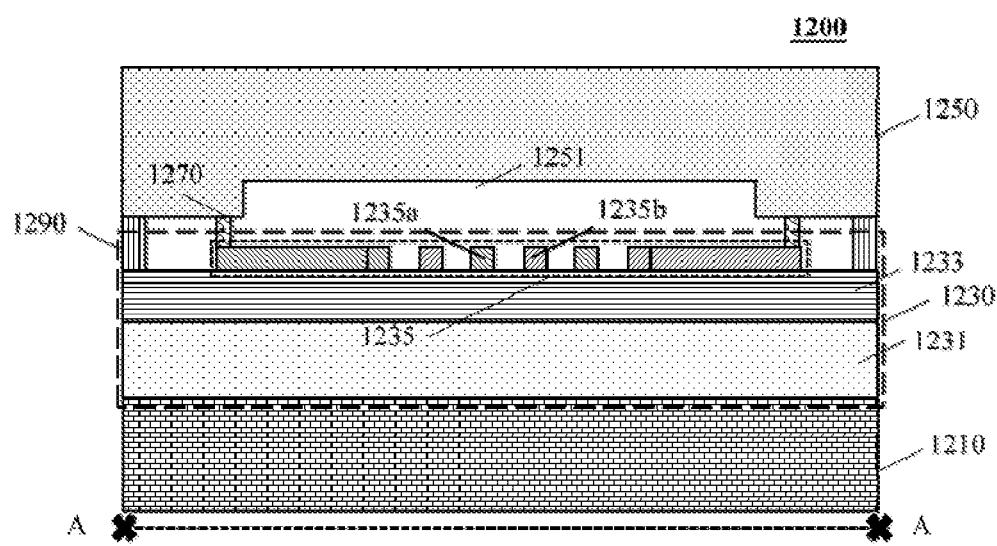
FIG. 12 is a structural diagram of cross-section A of a filter device 1200 in an embodiment of the invention.

FIG. 12 is a structural diagram of cross-section A of a filter device 1200 in an embodiment of the invention.

As shown in FIG. 12, an embodiment of the invention provides a filter device 1200 which comprises a substrate 1210, an SAW resonance device 1230 and a passive device 1250, wherein the substrate 1210 is a die substrate, the SAW resonance device 1230 is located over the substrate 1210, the passive device 1250 is located over the SAW resonance device 1230, and the SAW resonance device 1230 is electrically connected to the passive device 1250 through connectors 1270.

In this embodiment, the substrate 1210 and the passive device 1250 are located on two sides of the SAW resonance device 1230 respectively. In this embodiment, the substrate 1210, the SAW resonance device 1230 and the passive device 1250 are located in one die.

In this embodiment, the substrate 1210 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the SAW resonance device 1230 comprises an intermediate layer 1231, a piezoelectric layer 1233 and an electrode layer 1235, wherein the intermediate layer 1231 is located on the substrate 1210; the piezoelectric layer 1233 is located on the intermediate layer 1231, and the substrate 1210 and the piezoelectric layer 1233 are located on two sides of the intermediate layer 1231 respectively; and the electrode layer 1235 is located on the piezoelectric layer 1233, and the piezoelectric layer 1233 and the passive device 1250 are located on two sides of the electrode layer 1235 respectively.

In this embodiment, the intermediate layer 1231 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the piezoelectric layer 1233 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate. It should be noted that the acoustic impedance of the material of the intermediate layer 1231 is different from that of the material of the piezoelectric layer 1233, so that leaky waves can be blocked. In addition, if the material of the intermediate layer 1231 (such as silicon dioxide) and the material of the piezoelectric layer 1233 have opposite temperature-frequency drift characteristics, the temperature coefficient of frequency (TCF) of the resonance device can be decreased and tends to 0 ppm/° C., so that the frequency-temperature stability is improved. That is, the intermediate layer 1231 is a temperature compensation layer.

In this embodiment, the electrode layer 1235 comprises an IDT, wherein the IDT comprises multiple electrode bars 1235*a* and multiple electrode bars 1235*b*.

In this embodiment, the polarity of the multiple electrode bars 1235*a* is different from that of the multiple electrode bars 1235*b*. In this embodiment, the electrode bars 1235*a* and the electrode bars 1235*b* are disposed alternately. In this embodiment, the distances between the electrode bars 1235*a* and the adjacent electrode bars 1235*b* are equal. In another embodiment, the distances between every two of the adjacent electrode bars are different.

It should be noted that any IDT structures known by those skilled in the art can be applied to the embodiment of the invention.

In this embodiment, the passive device 1250 comprises, but is not limited to, at least one of a capacitor, an inductor, a resistor and a through hole. It should be noted that any passive devices (such as IPDs) known by those skilled in the art can be applied to the embodiment of the invention. In this embodiment, the passive device 1250 comprises a cavity 1251 located over the electrode layer 1235, and the cavity 1251 can optimize the height of the monolithic filter device. In another embodiment, a cavity may be formed over the resonance region by elevating the passive device.

In this embodiment, first terminals of the two connectors 1270 are electrically connected to the multiple electrode bars 1235*a* and the multiple electrode bars 1235*b* respectively, and second terminals of the connectors 1270 are electrically connected to the passive device 1250. In this embodiment, the connectors 1270 include, but are not limited to, at least one of an electrical wire, a bump, a pad and a through hole. It should be noted that any connecting structures known by those skilled in the art can be applied to the embodiment of the invention.

In this embodiment, the filter device 1200 further comprises a sealing element 1290, wherein the sealing element 1290 is disposed on the piezoelectric layer 1233 and located between the piezoelectric layer 1233 and the passive device 1250, at least encircles the cavity 1251 and is used to seal the cavity 1251.

It should be noted that the filter device formed by integrating the SAW resonance device and the passive device in one die can broaden the passband width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 13:
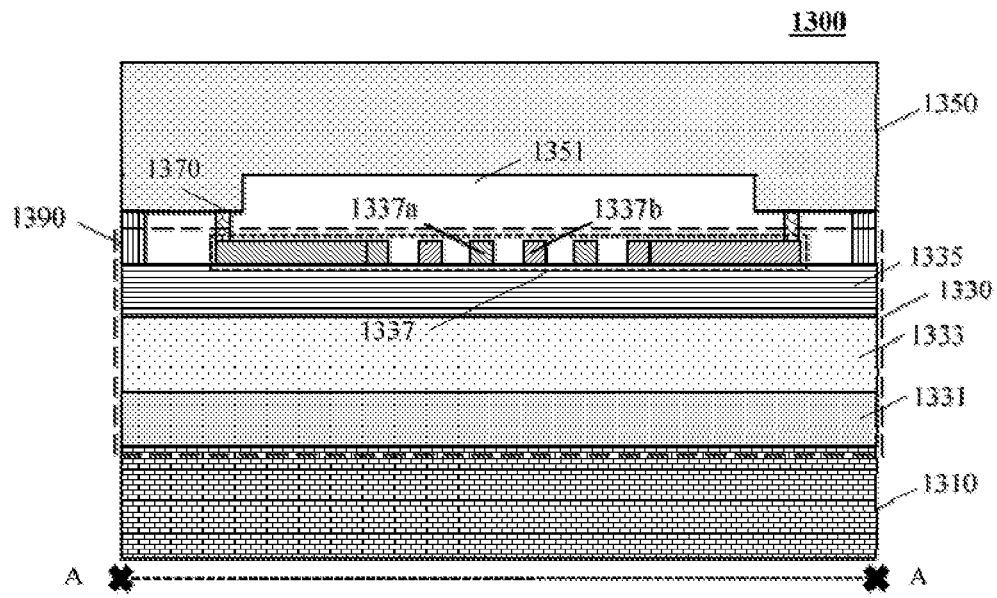
FIG. 13 is a structural diagram of cross-section A of a filter device 1300 in an embodiment of the invention.

FIG. 13 is a structural diagram of cross-section A of a filter device 1300 in an embodiment of the invention.

As shown in FIG. 13, an embodiment of the invention provides a filter device 1300 which comprises a substrate 1310, an SAW resonance device 1330 and a passive device 1350, wherein the substrate 1310 is a die substrate, the SAW resonance device 1330 is located over the substrate 1310, the passive device 1350 is located over the SAW resonance device 1330, and the SAW resonance device 1330 is electrically connected to the passive device 1350 through connectors 1370.

In this embodiment, the substrate 1310 and the passive device 1350 are located on two sides of the SAW resonance device 1330 respectively. In this embodiment, the substrate 1310, the SAW resonance device 1330 and the passive device 1350 are located in one die.

In this embodiment, the substrate 1310 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the SAW resonance device 1330 comprises an intermediate layer 1331, an intermediate layer 1333, a piezoelectric layer 1335 and an electrode layer 1337, wherein the intermediate layer 1331 is located on the substrate 1310; the intermediate layer 1333 is located on the intermediate layer 1331, and the substrate 1310 and the intermediate layer 1333 are located on two sides of the intermediate layer 1331 respectively; the piezoelectric layer 1335 is located on the intermediate layer 1333; and the electrode layer 1337 is located on the piezoelectric layer 1335, and the intermediate layer 1333 and the electrode layer 1337 are located on two sides of the piezoelectric layer 1355 respectively.

In this embodiment, the intermediate layer 1331 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the intermediate layer 1333 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the piezoelectric layer 1335 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

It should be noted that the acoustic impedance of the material of the intermediate layer 1331 is different from that of the material of the intermediate layer 1333, and the acoustic impedance of the material of the intermediate layer 1333 is different from that of the material of the intermediate layer 1335, so that leaky waves can be blocked. In addition, if the material of the intermediate layer 1333 (such as silicon dioxide) and the material of the piezoelectric layer 1335 have opposite temperature-frequency drift characteristics, the TCF of the resonance device can be decreased and tends to 0 ppm/° C., so that the frequency-temperature stability is improved. That is, the intermediate layer 1333 is a temperature compensation layer.

In this embodiment, the electrode layer 1337 comprises an IDT, wherein the IDT comprises multiple electrode bars 1337*a* and multiple electrode bars 1337*b*.

In this embodiment, the polarity of the multiple electrode bars 1337*a* is different from that of the multiple electrode bars 1337*b*. In this embodiment, the electrode bars 1337*a* and the electrode bars 1337*b* are disposed alternately. In this embodiment, the distances between the electrode bars 1337*a* and the adjacent electrode bars 1337*b* are equal. In another embodiment, the distances between every two of the adjacent electrode bars are different.

It should be noted that any IDT structures known by those skilled in the art can be applied to the embodiment of the invention.

In this embodiment, the passive device 1350 comprises, but is not limited to, at least one of a capacitor, an inductor, a resistor and a through hole. It should be noted that any passive devices (such as IPDs) known by those skilled in the art can be applied to the embodiments of the invention. In this embodiment, the passive device 1350 comprises a cavity 1351 located over the electrode layer 1337, and the cavity 1351 can optimize the height of the monolithic filter device. In another embodiment, a cavity may be formed over the resonance region by elevating the passive device.

In this embodiment, first terminals of the two connectors 1370 are electrically connected to the multiple electrode bars 1337*a* and the multiple electrode bars 1337*b* respectively, and second terminals of the connectors 1370 are electrically connected to the passive device 1350. In this embodiment, the connectors 1370 include, but are not limited to, at least one of an electrical wire, a bump, a pad and a through hole. It should be noted that any connecting structures known by those skilled in the art can be applied to the embodiment of the invention.

In this embodiment, the filter device 1300 further comprises a sealing element 1390, wherein the sealing element 1390 is disposed on the piezoelectric layer 1335 and located between the piezoelectric layer 1335 and the passive device 1350, at least encircles the cavity 1351 and is used to seal the cavity 1351.

It should be noted that the filter device formed by integrating the SAW resonance device and the passive device in one die can broaden the passband width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 14:
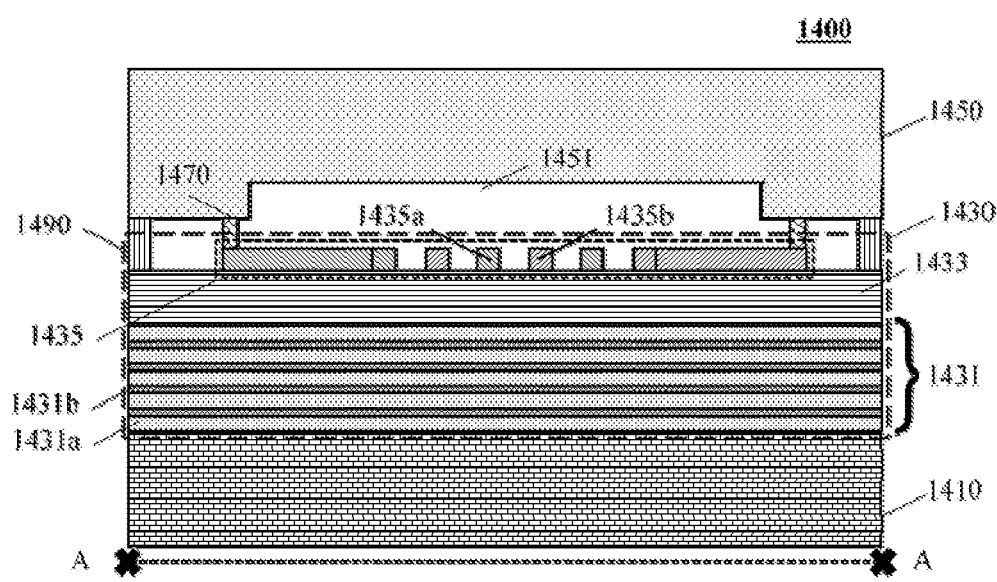
FIG. 14 is a structural diagram of cross-section A of a filter device 1400 in an embodiment of the invention.

FIG. 14 is a structural diagram of cross-section A of a filter device 1400 in an embodiment of the invention.

As shown in FIG. 14, an embodiment of the invention provides a filter device 1400 which comprises a substrate 1410, an SAW resonance device 1430 and a passive device 1450, wherein the substrate 1410 is a die substrate, the SAW resonance device 1430 is located over the substrate 1410, the passive device 1450 is located over the SAW resonance device 1430, and the SAW resonance device 1430 is electrically connected to the passive device 1450 through connectors 1470.

In this embodiment, the substrate 1410 and the passive device 1450 are located on two sides of the SAW resonance device 1430 respectively. In this embodiment, the substrate 1410, the SAW resonance device 1430 and the passive device 1450 are located in one die.

In this embodiment, the substrate 1410 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the SAW resonance device 1430 comprises a reflection layer 1431, a piezoelectric layer 1433 and an electrode layer 1435, wherein the reflection layer 1431 is located on the substrate 1410; the piezoelectric layer 1433 is located on the reflection layer 1431, and the substrate 1410 and the piezoelectric layer 1433 are located on two sides of the piezoelectric layer 1433 respectively; and the electrode layer 1435 is located on the piezoelectric layer 1433.

In this embodiment, the reflection layer 1431 comprises multiple sub-reflection layers 1431*a* and multiple sub-reflection layers 1431*b*, wherein the sub-reflection layers 1431*a* and the sub-reflection layers 1431*b* are disposed alternately.

In this embodiment, the sub-reflection layers 1431*a* and the sub-reflection layers 1431*b* are made of different materials, so that the acoustic impedance of the sub-reflection layers 1431*a* is different from that of the sub-reflection layers 1431*b*. In this embodiment, the sub-reflection layers 1431*a* are made of, but not limited to, at least one of the following materials: silicon oxycarbide, silicon nitride, silicon dioxide, aluminum nitride, tungsten and molybdenum. In this embodiment, the sub-reflection layers 1431*b* are made of, but not limited to, at least one of the following materials: silicon oxycarbide, silicon nitride, silicon dioxide, aluminum nitride, tungsten and molybdenum.

In this embodiment, the reflection layer 1431 is a quarter-wave Bragg mirror. In this embodiment, the thickness of the sub-reflection layers 1431*a* is twice that of the sub-reflection layers 1431*b*. In another embodiment, the sub-reflection layers have the same thickness. It should be noted that the quarter-wave Bragg mirror in this embodiment is merely a specific example which is not intended to limit the invention, and all other acoustic reflection layers known by those skilled in the art can be applied to the embodiments of the invention.

In this embodiment, the piezoelectric layer 1433 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the electrode layer 1435 comprises an IDT, wherein the IDT comprises multiple electrode bars 1435a and multiple electrode bars 1435b.

In this embodiment, the polarity of the multiple electrode bars 1435a is different from that of the multiple electrode bars 1435b. In this embodiment, the electrode bars 1235a and the electrode bars 1435b are disposed alternately. In this embodiment, the distances between the electrode bars 1435a and the adjacent electrode bars 1235b are equal. In another embodiment, the distances between every two of the adjacent electrode bars are different.

It should be noted that any IDT structures known by those skilled in the art can be applied to the embodiment of the invention.

In this embodiment, the passive device 1450 comprises, but is not limited to, at least one of a capacitor, an inductor, a resistor and a through hole. It should be noted that any passive devices (such as IPDs) known by those skilled in the art can be applied to the embodiment of the invention. In this embodiment, the passive device 1450 comprises a cavity 1451 located over the electrode layer 1435, and the cavity 1451 can optimize the height of the monolithic filter device. In another embodiment, a cavity may be formed over the resonance region by elevating the passive device.

In this embodiment, first terminals of the two connectors 1470 are electrically connected to the multiple electrode bars 1435a and the multiple electrode bars 1435b respectively, and second terminals of the connectors 1470 are electrically connected to the passive device 1450. In this embodiment, the connectors 1470 include, but are not limited to, at least one of an electrical wire, a bump, a pad and a through hole. It should be noted that any connecting structures known by those skilled in the art can be applied to the embodiment of the invention.

In this embodiment, the filter device 1400 further comprises a sealing element 1490, wherein the sealing element 1490 is disposed on the piezoelectric layer 1433 and located between the piezoelectric layer 1433 and the passive device 1450, at least encircles the cavity 1451 and is used to seal the cavity 1451.

It should be noted that the filter device formed by integrating the SAW resonance device and the passive device in one die can broaden the passband width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

An embodiment of the invention further provides a filter device (not shown) which comprises a first substrate, a first SAW resonance device and a first passive device, wherein the first substrate is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate. In this embodiment, the first SAW resonance device comprises a first electrode layer, wherein the first electrode layer is located on the first substrate and comprises a first IDT. In this embodiment, the first passive device is located over the first electrode layer, the first electrode layer is electrically connected to the first passive device through first connectors, and the first substrate and the first passive device are located on two sides of the first electrode respectively.

An embodiment of the invention further provides a filter device (not shown) which comprises a second substrate, a second SAW resonance device and a second passive device, wherein the second substrate is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate. In this embodiment, the second SAW resonance device comprises a second electrode layer, wherein the second electrode layer is located on the second substrate and comprises a second IDT. In this embodiment, the second passive device is located over the second electrode layer, the second electrode layer is electrically connected to the second passive device through second connectors, and the second substrate and the second passive device are located on two sides of the second electrode respectively. In this embodiment, the second SAW resonance device further comprises a temperature compensation layer, wherein the temperature compensation layer is located on the second substrate and covers the second electrode layer, and the second substrate and the second passive device are located on two sides of the temperature compensation layer respectively. It should be noted that the material of the temperature compensation layer (such as silicon dioxide) and the material of the second substrate have opposite temperature-frequency drift characteristics, so that the TCF of the resonance device can be decreased and tends to 0 ppm/° C., thus improving the frequency-temperature stability.

FIG. 15 to FIG. 17 illustrate multiple specific embodiments, adopting different passive devices, of the invention. Clearly, the invention can also be implemented through other embodiments different from those described hereinafter. Hence, the invention is not limited to the specific embodiments disclosed below.

Figure 15A:
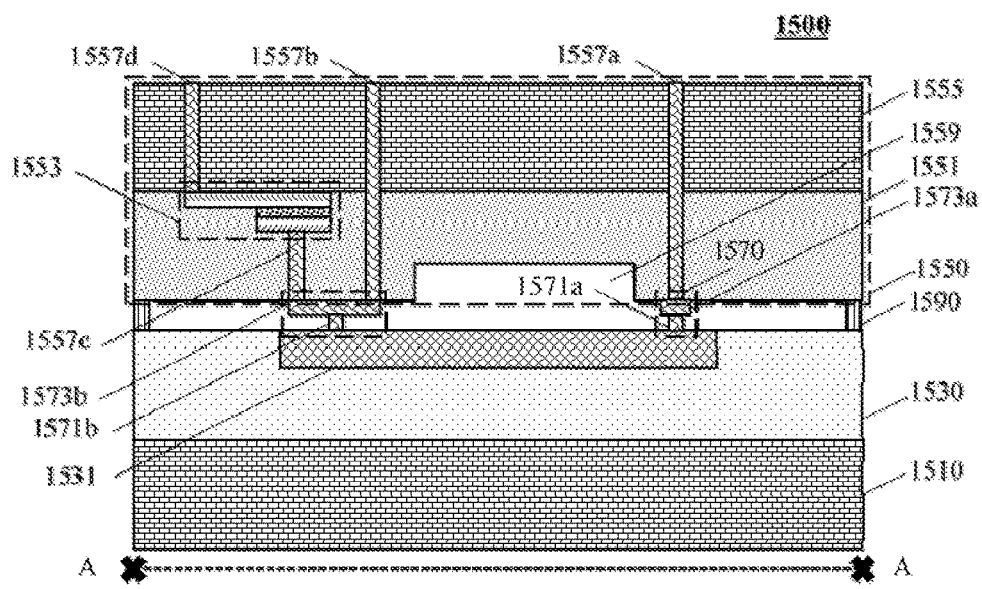
FIG. 15a is a structural diagram of cross-section A of a filter device 1500 in an embodiment of the invention.

FIG. 15a is a structural diagram of cross-section A of a filter device 1500 in an embodiment of the invention.

As shown in FIG. 15a, an embodiment of the invention provides a filter device 1500 which comprises a substrate 1510, a resonance device 1530 and a passive device 1550, wherein the substrate 1510 is a die substrate, the resonance device 1530 is located over the substrate 1510, the passive device 1550 is located over the resonance device 1530, and the resonance device 1530 is electrically connected to the passive device 1550 through connectors 1570.

In this embodiment, the substrate 1510 is located on a first side of the resonance device 1530, and the passive device 1550 is located on a second side of the resonance device 1530, wherein the first side and the second of the resonance device 1530 are opposite. In this embodiment, the substrate 1510, the resonance device 1530 and the passive device 1550 are located in one die.

In this embodiment, the substrate 1510 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the resonance device 1530 includes, but is not limited to, at least one of an SAW resonance device and a BAW resonance device. In this embodiment, the resonance device 1530 comprises an active region 1531, and the active region 1531 comprises a piezoelectric layer (not shown) and at least one electrode layer (not shown).

In this embodiment, the passive device 1550 comprises an intermediate layer 1551, a substrate 1555, a through hole 1557a, a through hole 1557b, a through hole 1557c and a through hole 1557d, wherein the intermediate layer 1551 comprises a capacitor 1553; the substrate 1555 is located on the intermediate layer 1551; the through hole 1557a penetrates through the passive device 1550, and a first terminal on the upper side of the through hole 1557a is to be connected to an input terminal of the filter device 1500; the through hole 1557b penetrates through the passive device 1550, and a first terminal on the upper side of the through hole 1557b is to be connected to an output terminal of the filter device 1500; the through hole 1557c is inlaid in the intermediate layer 1551, and a first terminal on the upper side of the through hole 1557c is electrically connected to a second terminal on the lower side of the capacitor 1533; and the through hole 1557d penetrates through the substrate 1555, a first terminal on the upper side of the through hole 1557d is grounded, and a second terminal on the lower side of the through hole 1557d is electrically connected to a first terminal on the upper side of the capacitor 1553.

In this embodiment, the intermediate layer 1551 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the intermediate layer 1551 further comprises a cavity 1559 located over the active layer 1531, and the cavity 1559 can optimize the height of the monolithic filter device. In another embodiment, a cavity may be formed over the active layer by elevating the passive device.

In this embodiment, the capacitor 1553 is a metal-insulator-metal (MIM) capacitor. In this embodiment, the capacitor 1553 is formed through a semiconductor process. It should be noted that the MIM capacitor in this embodiment is merely a specific example which is not intended to limit the invention, and capacitors manufactured through other semiconductor processes known by those skilled in the art, such as metal-oxide-metal (MOM) capacitors, can also be applied to the embodiment of the invention.

In this embodiment, the substrate 1555 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the connectors 1570 include a bump 1571a, a bump 1571b, a pad 1573a and a pad 1573b, wherein the bump 1571a is electrically connected to a first terminal (such as a first electrode) of the active layer 1531; the bump 1571b is electrically connected to a second terminal (such as a second electrode) of the active layer 1531; the pad 1573a is located on the bump 1571a, the upper side of the pad 1573a is electrically connected to a second terminal on the lower side of the through hole 1557a, and the lower side of the pad 1573a is electrically connected to the bump 1571a; the pad 1573b is located on the bump 1571b, the upper side of the pad 1573b is electrically connected to a second terminal on the lower side of the through hole 1557b and a second terminal on the lower side of the through hole 1557c, and the lower side of the pad 1573b is electrically connected to the bump 1571b.

In this embodiment, the filter device 1500 further comprises a sealing element 1590, wherein the sealing element 1590 is located between the resonance device 1530 and the passive device 1550, at least encircles the cavity 1559 and is used to seal the cavity 1559.

Figure 15B:
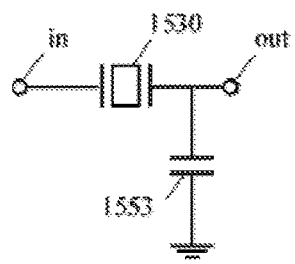
FIG. 15b is a structural diagram of cross-section A of a filter device 1500 in an embodiment of the invention.

FIG. 15b is an equivalent circuit diagram of the filter device 1500 in the embodiment of the invention.

As shown in FIG. 15b, the equivalent circuit diagram of the filter device 1500 includes the resonance device 1530 and the capacitor 1553, wherein a first terminal of the resonance device 1530 is connected to an input terminal in, a second terminal of the resonance device 1530 is electrically connected to a first terminal of the capacitor 1553, a second terminal of the resonance device 1530 is connected to an output terminal out, the first terminal of the capacitor 1553 is also connected to an output terminal out, and a second terminal of the capacitor 1553 is grounded.

It should be noted that the filter device formed by integrating the resonance device and the passive device in one die can broaden the passband width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 16A:
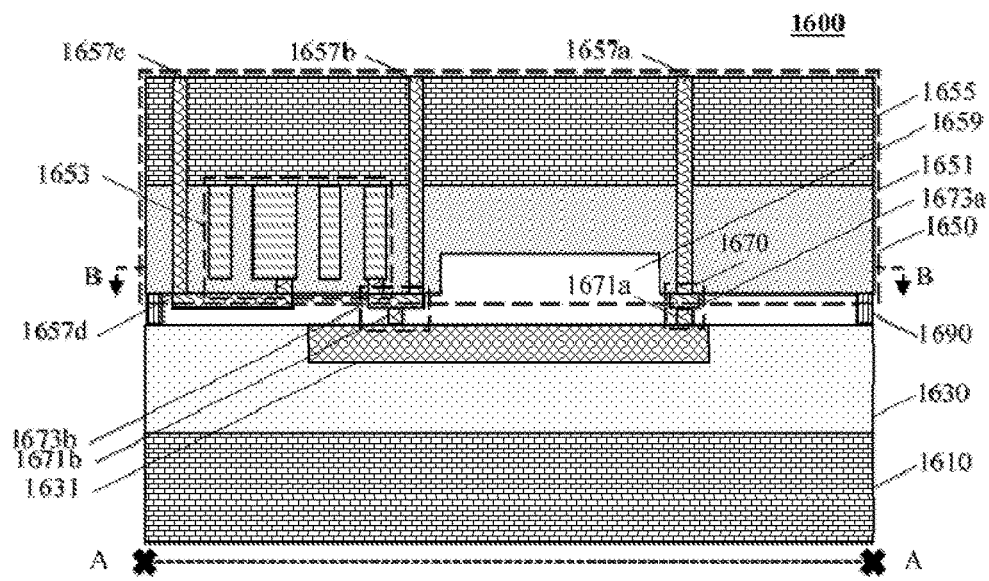
FIG. 16a is a structural diagram of cross-section A of a filter device 1600 in an embodiment of the invention.

FIG. 16a is a structural diagram of cross-section A of a filter device 1600 in an embodiment of the invention.

As shown in FIG. 16a, an embodiment of the invention provides a filter device 1600 which comprises a substrate 1610, a resonance device 1630 and a passive device 1650, wherein the substrate 1610 is a die substrate, the resonance device 1630 is located over the substrate 1610, the passive device 1650 is located over the resonance device 1630, and the resonance device 1630 is electrically connected to the passive device 1650 through connectors 1670.

In this embodiment, the substrate 1610 is located on a first side of the resonance device 1630, and the passive device 1650 is located on a second side of the resonance device 1630, wherein the first side and the second side of the resonance device 1630 are opposite. In this embodiment, the substrate 1610, the resonance device 1630 and the passive device 1650 are located in one die.

In this embodiment, the substrate 1610 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the resonance device 1630 includes, but is not limited to, at least one of an SAW resonance device and a BAW resonance device. In this embodiment, the resonance device 1630 comprises an active region 1631, and the active region 1631 comprises a piezoelectric layer (not shown) and at least one electrode layer (not shown).

In this embodiment, the passive device 1650 comprises an intermediate layer 1651, a substrate 1655, a through hole 1657*a*, a through hole 1657*b* and a through hole 1657*c*, wherein the intermediate layer 1651 comprises an inductor 1653; the substrate 1655 is located on the intermediate layer 1651; the through hole 1657*a* penetrates through the passive device 1650, and a first terminal on the upper side of the through hole 1657*a* is to be connected to an input terminal of the filter device 1600; the through hole 1657*b* penetrates through the passive device 1650, and a first terminal on the upper side of the through hole 1657*b* is to be connected to an output terminal of the filter device 1600; the through hole 1657*c* penetrates through the passive device 1650, a first terminal on the upper side of the through hole 1557*c* is grounded, and a second terminal on the lower side of the through hole 1657*c* is electrically connected to a first terminal of the inductor 1653 through a connecting wire 1657*d*.

In this embodiment, the intermediate layer 1651 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the intermediate layer 1651 further comprises a cavity 1659 located over the active layer 1631, and the cavity 1659 can optimize the height of the monolithic filter device. In another embodiment, a cavity may be formed over the active layer by elevating the passive device.

In this embodiment, the inductor 1653 is a spiral inductor. In this embodiment, the inductor 1653 is formed through a semiconductor process. It should be noted that the spiral inductor in this embodiment is merely a specific example which is not intended to limit the invention, and inductors manufactured through other semiconductor processes known by those skilled in the art can also be applied to the embodiment of the invention.

In this embodiment, the thickness of the inductor 1653 is smaller than that of the intermediate layer 1651. In another embodiment, the thickness of the inductor is equal to that of the intermediate layer.

In this embodiment, the substrate 1655 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the connectors 1670 include a bump 1671*a*, a bump 1671*b*, a pad 1673*a* and a pad 1673*b*, wherein the bump 1671*a* is electrically connected to a first terminal (such as a first electrode) of the active layer 1631; the bump 1671*b* is electrically connected to a second terminal (such as a second electrode) of the active layer 1631; the pad 1673*a* is located on the bump 1671*a*, the upper side of the pad 1673*a* is electrically connected to a second terminal on the lower side of the through hole 1657*a*, and the lower side of the pad 1673*a* is electrically connected to the bump 1671*a*; the pad 1673*b* is located on the bump 1671*b*, the upper side of the pad 1673*b* is electrically connected to a second terminal on the lower side of the through hole 1657*b* and a second terminal of the inductor 1653, and the lower side of the pad 1673*b* is electrically connected to the bump 1671*b*.

In this embodiment, the filter device 1600 further comprises a sealing element 1690, wherein the sealing element 1690 is located between the resonance device 1630 and the passive device 1650, at least encircles the cavity 1659 and is used to seal the cavity 1659.

Figure 16B:
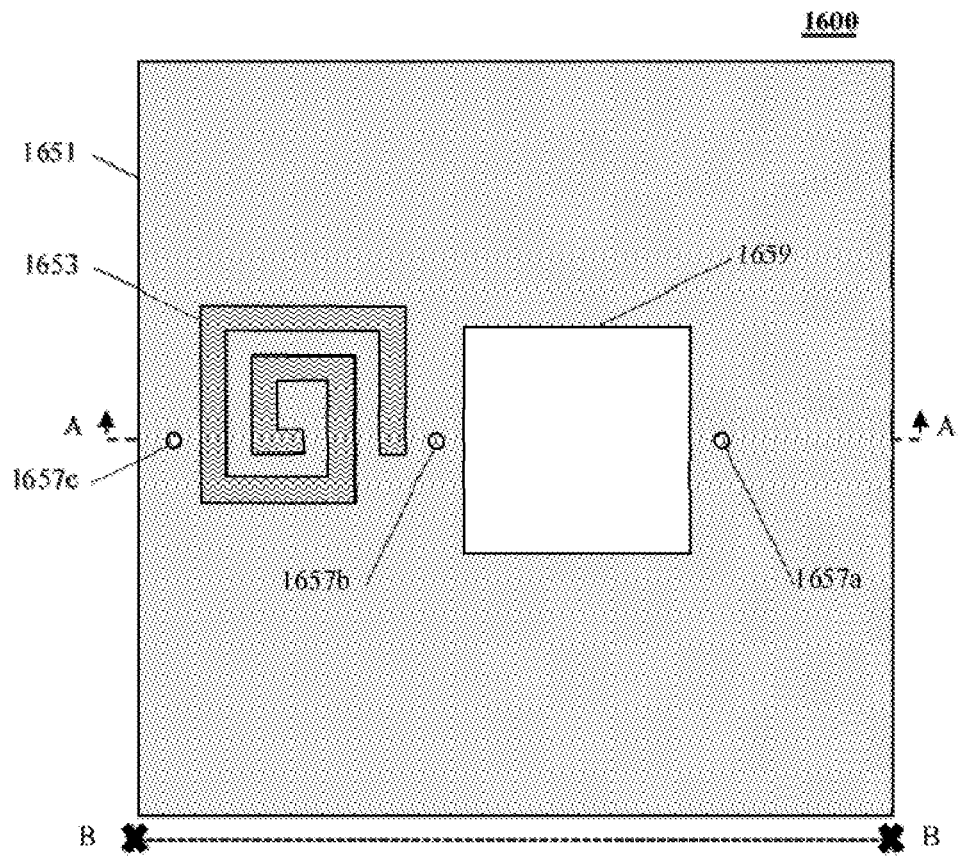
FIG. 16b is a structural diagram of cross-section B of the filter device 1600 in the embodiment of the invention.

FIG. 16*b* is a schematic diagram of cross-section B of the filter device 1600 in this embodiment of the invention.

In this embodiment, cross-section B of the inductor 1653 is quadrangular. In another embodiment, cross-section B of the inductor is of, but not limited to, at least one of the following shapes: pentagonal shape, hexagonal shape, octagonal shape, circular shape and oval shape. In this embodiment, the inductor 1653 comprises two layers of coils. In another embodiment, the inductor comprises three or more layers of coils. It should be noted that the spiral inductor in this embodiment is merely a specific example which is not intended to limit the invention, and other spiral inductors known by those skilled in the art can also be applied to the embodiment of the invention.

In this embodiment, cross-section B of the cavity 1659 is quadrangular. In another embodiment, cross-section B of the cavity is of, but not limited to, at least one of the following shapes: pentagonal shape, hexagonal shape, octagonal shape, circular shape and oval shape.

Figure 16C:
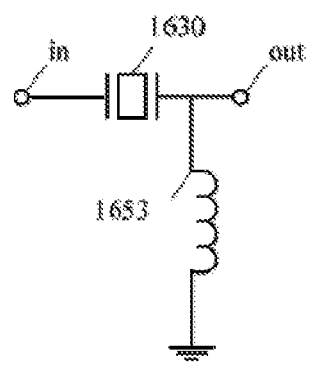
FIG. 16c is an equivalent circuit diagram of the filter device 1600 in the embodiment of the invention.

FIG. 16*c* is an equivalent circuit diagram of the filter device 1600 in this embodiment of the invention As shown in FIG. 16*c*, the equivalent circuit diagram of the filter device 1600 includes the resonance device 1630 and the inductor 1653, wherein a first terminal of the resonance device 1630 is connected to an input terminal in, a second terminal of the resonance device 1630 is electrically connected to a first terminal of the inductor 1653, a second terminal of the resonance device 1630 is connected to an output terminal out, the first terminal of the inductor 1653 is also connected to an output terminal out, and a second terminal of the inductor 1653 is grounded.

It should be noted that the filter device formed by integrating the resonance device and the passive device in one die can broaden the passband width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 17A:
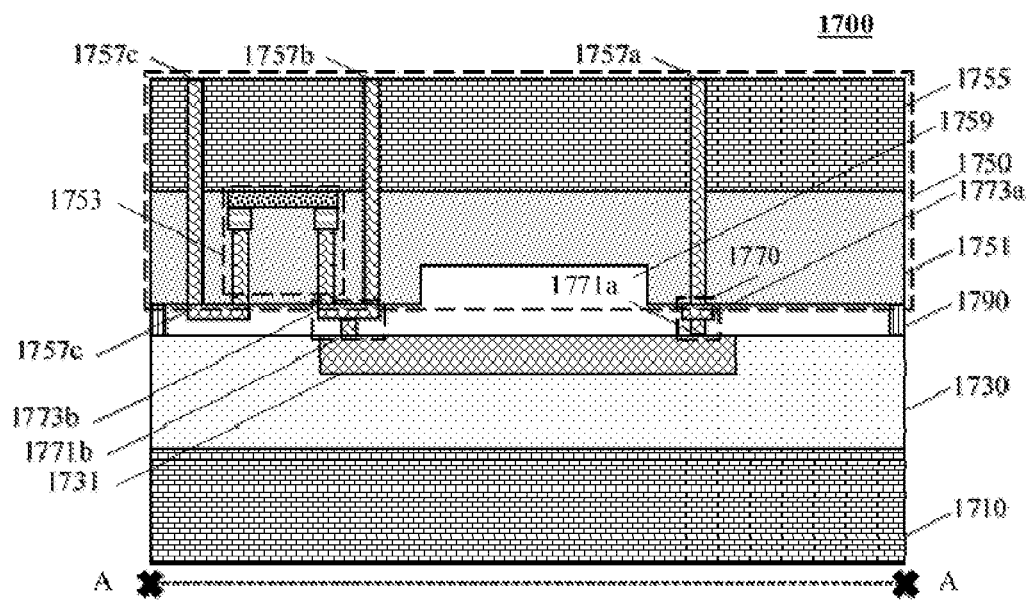
FIG. 17a is a structural diagram of cross-section A of a filter device 1700 in an embodiment of the invention.

FIG. 17*a* is a structural diagram of cross-section A of a filter device 1700 in an embodiment of the invention.

As shown in FIG. 17*a*, an embodiment of the invention provides a filter device 1700 which comprises a substrate 1710, a resonance device 1730 and a passive device 1750, wherein the substrate 1710 is a die substrate, the resonance device 1730 is located over the substrate 1710, the passive device 1750 is located over the resonance device 1730, and the resonance device 1730 is electrically connected to the passive device 1750 through connectors 1770.

In this embodiment, the substrate 1710 is located on a first side of the resonance device 1730, and the passive device 1750 is located on a second side of the resonance device 1730, wherein the first side and the second side of the resonance device 1730 are opposite. In this embodiment, the substrate 1710, the resonance device 1730 and the passive device 1750 are located in one die.

In this embodiment, the substrate 1710 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the resonance device 1730 includes, but is not limited to, at least one of an SAW resonance device and a BAW resonance device. In this embodiment, the resonance device 1730 comprises an active region 1731, and the active region 1731 comprises a piezoelectric layer (not shown) and at least one electrode layer (not shown).

In this embodiment, the passive device 1750 comprises an intermediate layer 1751, a substrate 1755, a through hole 1757*a*, a through hole 1757*b* and a through hole 1757*c*, wherein the intermediate layer 1751 comprises a resistor 1753; the substrate 1755 is located on the intermediate layer 1751; the through hole 1757*a* penetrates through the passive device 1750, and a first terminal on the upper side of the through hole 1757*a* is to be connected to an input terminal of the filter device 1700; the through hole 1757*b* penetrates through the passive device 1750, and a first terminal on the upper side of the through hole 1757*b* is to be connected to an output terminal of the filter device 1700; the through hole 1757*c* penetrates through the passive device 1750, a first terminal on the upper side of the through hole 1757*c* is grounded, and a second terminal on the lower side of the through hole 1757*c* is electrically connected to a first terminal of the resistor 1753 through a connecting wire 1757*d*.

In this embodiment, the intermediate layer 1751 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the intermediate layer 1751 further comprises a cavity 1759 located over the active layer 1731, and the cavity 1759 can optimize the height of the monolithic filter device. In another embodiment, a cavity may be formed over the active layer by elevating the passive device.

In this embodiment, the resistor 1753 is formed through a semiconductor process. It should be noted that the resistor in this embodiment is merely a specific example which is not intended to limit the invention, and resistors manufactured through other semiconductor processes known by those skilled in the art can also be applied to the embodiment of the invention.

In this embodiment, the substrate 1755 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the connectors 1770 include a bump 1771*a*, a bump 1771*b*, a pad 1773*a* and a pad 1773*b*, wherein the bump 1771*a* is electrically connected to a first terminal (such as a first electrode) of the active layer 1731; the bump 1771*b* is electrically connected to a second terminal (such as a second electrode) of the active layer 1731; the pad 1773*a* is located on the bump 1771*a*, the upper side of the pad 1773*a* is electrically connected to a second terminal on the lower side of the through hole 1757*a*, and the lower side of the pad 1773*a* is electrically connected to the bump 1771*a*; the pad 1773*b* is located on the bump 1771*b*, the upper side of the pad 1773*b* is electrically connected to a second terminal on the lower side of the through hole 1757*b* and a second terminal of the resistor 1753, and the lower side of the pad 1773*b* is electrically connected to the bump 1771*b*.

In this embodiment, the filter device 1700 further comprises a sealing element 1790, wherein the sealing element 1790 is located between the resonance device 1730 and the passive device 1750, at least encircles the cavity 1759 and is used to seal the cavity 1759.

Figure 17B:
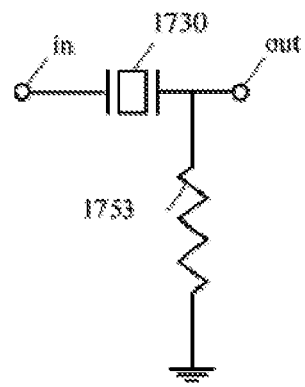
FIG. 17b is an equivalent circuit diagram of the filter device 1700 in the embodiment of the invention.

FIG. 17*b* is an equivalent circuit diagram of the filter device 1700 in this embodiment of the invention.

As shown in FIG. 17*b*, the equivalent circuit diagram of the filter device 1700 includes the resonance device 1730 and the resistor 1753, wherein a first terminal of the resonance device 1730 is connected to an input terminal in, a second terminal of the resonance device 1730 is electrically connected to a first terminal of the resistor 1753, a second terminal of the resonance device 1730 is connected to an output terminal out, the first terminal of the resistor 1753 is also connected to the output terminal out, and a second terminal of the inductor 1753 is grounded.

It should be noted that the filter device formed by integrating the resonance device and the passive device in one die can broaden the passband width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

FIG. 18 shows a specific embodiment of the invention. Obviously, the invention can also be implemented through other embodiments different from the one described herein. Hence, the invention is not limited to the specific embodiment disclosed below.

Figure 18A:
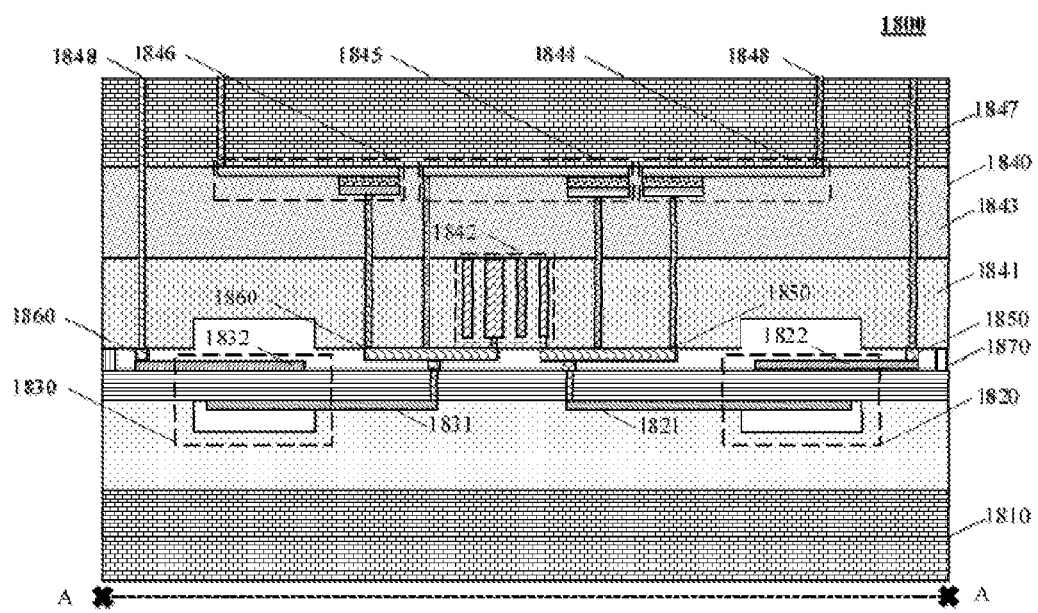
FIG. 18a is a structural diagram of cross-section A of a filter device 1800 in an embodiment of the invention.

FIG. 18*a* is a structural diagram of cross-section A of a filter device 1800 in an embodiment of the invention.

As shown in FIG. 18*a*, an embodiment of the invention provides a filter device 1800 which comprises a substrate 1810, a BAW resonance device 1820, a BAW resonance device 1830 and an IPD 1840, wherein the substrate 1810 is a die substrate, the BAW resonance device 1820 is located over the substrate 1810, the BAW resonance device 1830 is located over the substrate 1810, the IPD 1840 is located over the BAW resonance device 1820 and the BAW resonance device 1830, the BAW resonance device 1820 is electrically connected to the IPD 1840 through connectors 1850, and the BAW resonance device 1830 is electrically connected to the IPD 1840 through connectors 1860.

In this embodiment, the substrate 1810 and the IPD 1840 are located on two sides of the BAW resonance device 1820 respectively and are also located on two sides of the BAW resonance device 1830 respectively. In this embodiment, the substrate 1810, the BAW resonance device 1820, the BAW resonance device 1830 and the IPD 1840 are located in one die.

In this embodiment, the substrate 1810 is made of, but not limited to, at least one of the following materials: silicon, silicon carbide, silicon dioxide, gallium arsenide, gallium nitride, aluminum oxide, magnesium oxide, ceramic and polymer. In this embodiment, the polymer includes, but is not limited to, at least one of benzocyclobutene (BCB), photosensitive epoxy resin photoresist (such as SU-8) and polyimide.

In this embodiment, the BAW resonance device 1820 comprises, but is not limited to, a piezoelectric layer (not shown), an electrode layer 1821 and an electrode layer 1822, wherein the electrode layer 1821 and the electrode layer 1822 are located on two sides of the piezoelectric layer. It should be noted that the BAM resonance device 1820 in this embodiment is merely a specific example which is not intended to limit the invention and other BAW resonance devices or SAW resonance devices known by those skilled in the art can be applied to the embodiment of the invention.

In this embodiment, the BAW resonance device 1830 comprises, but is not limited to, a piezoelectric layer (not shown), an electrode layer 1831 and an electrode layer 1832, wherein the electrode layer 1831 and the electrode layer 1832 are located on two sides of the piezoelectric layer. It should be noted that the BAM resonance device 1830 in this embodiment is merely a specific example which is not intended to limit the invention and other BAW resonance devices or SAW resonance devices known by those skilled in the art can be applied to the embodiment of the invention.

In another embodiment, the filter device comprises three or more BAW or SAW resonance devices. In another embodiment, the filter device comprises at least one BAW resonance device and at least one SAW resonance device.

In this embodiment, the IPD 1840 comprises an intermediate layer 1841, an intermediate layer 1843, a substrate 1847 and multiple through holes 1848, wherein the intermediate layer 1841 is located over the BAW resonance device 1820 and the BAW resonance device 1830 and comprises an inductor 1842; the intermediate layer 1843 is located on the intermediate layer 1841 and comprises a capacitor 1844, a capacitor 1845 and a capacitor 1846, and the substrate 1847 is located on the intermediate layer 1843.

In this embodiment, the intermediate layer 1841 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the intermediate layer 1841 further comprises a first cavity (not shown) located over the BAW resonance device 1820, and the first cavity can optimize the height of the monolithic filter device.

In this embodiment, the intermediate layer 1841 further comprises a second cavity (not shown) located over the BAW resonance device 1830, and the second cavity can optimize the height of the monolithic filter device.

In another embodiment, cavities may be formed over the resonance devices by elevating the passive device.

In this embodiment, the inductor 1842 is a spiral inductor. In this embodiment, the inductor 1842 is formed through a semiconductor process. It should be noted that the spiral inductor in this embodiment is merely a specific example which is not intended to limit the invention, and inductors manufactured through other semiconductor processes known by those skilled in the art can also be applied to the embodiment of the invention.

In this embodiment, the thickness of the inductor 1842 is smaller than that of the intermediate layer 1841. In another embodiment, the thickness of the inductor is equal to that of the intermediate layer.

In this embodiment, the intermediate layer 1843 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide.

In this embodiment, the capacitor 1844, the capacitor 1845 and the capacitor 1846 are MIM capacitors. In this embodiment, the capacitor 1844, the capacitor 1845 and the capacitor 1846 are formed through a semiconductor process. It should be noted that the MIM capacitors in this embodiment are merely specific examples which are not intended to limit the invention, and capacitors manufactured through other semiconductor processes known by those skilled in the art, such as metal-oxide-metal (MOM) capacitors, can also be applied to the embodiment of the invention.

In this embodiment, the electrode layer 1822 is connected to an input terminal through one connector 1850 and one through hole 1848; the electrode layer 1821 is electrically connected to a first terminal of the inductor 1842, a first terminal on the lower side of the capacitor 1844 and a first terminal on the lower side of the capacitor 1845 through the corresponding connectors 1850 and the corresponding through holes 1848; a second terminal on the upper side of the capacitor 1844 is grounded through one through hole 1848; a second terminal of the inductor 1842 and a second terminal on the upper side of the capacitor 1845 are electrically connected to the electrode layer 1831 through the corresponding connectors 1860 and the corresponding through holes 1848; the electrode layer 1831 is connected to a first terminal on the lower side of the capacitor 1846 through one connector 1860 and one through hole 1848; a second terminal on the upper side of the capacitor 1846 is grounded through one through hole 1848; and the electrode layer 1832 is electrically connected to an output terminal through one connector 1860 and one through hole 1848.

Figure 18B:
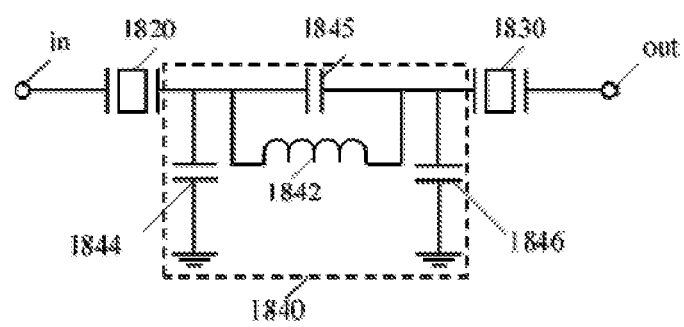
FIG. 18b is an equivalent circuit diagram of the filter device 1800 in the embodiment of the invention.

FIG. 18*b* is an equivalent circuit diagram of the filter device 1800 in this embodiment of the invention.

As shown in FIG. 18*b*, the equivalent circuit diagram of the filter device 1800 comprises the BAW resonance device 1820, the BAW resonance device 1830, the inductor 1842, the capacitor 1844, the capacitor 1845 and the capacitor 1846, wherein a first terminal of the BAW resonance device 1820 is connected to an input terminal in, and a second terminal of the BAW resonance device 1820 is electrically connected to a first terminal of the inductor 1842, a first terminal of the capacitor 1844 and a first terminal of the capacitor 1845; the first terminal of the capacitor 1844 is also electrically connected to a first terminal of the capacitor 1845 and a first terminal of the inductor 1842; a second terminal of the capacitor 1844 is grounded; the first terminal of the inductor 1842 is also electrically connected to the first terminal of the capacitor 1845; a second terminal of the inductor 1842 is electrically connected to a second terminal of the capacitor 1845, a first terminal of the BAW resonance device 1830 and a first terminal of the capacitor 1846; the second terminal of the capacitor 1845 is also electrically connected to the first terminal of the BAW resonance device 1830 and a first terminal of the capacitor 1846; the first terminal of the capacitor 1846 is electrically connected to the first terminal of the BAW resonance device 1830; a second terminal of the capacitor 1846 is grounded; and a second terminal of the BAW resonance device 1830 is connected to an output terminal out.

In this embodiment, an equivalent circuit of the IPD 1840 formed by the capacitor 1844, the capacitor 1845, the capacitor 1846 and the inductor 1842 is a band-pass filter circuit. In another embodiment, the equivalent circuit of the IPD includes, but is not limited to, at least one of a low-pass filter circuit, a high-pass filter circuit and a band-stop filter circuit.

It should be noted that the circuit in this embodiment is merely a specific example which is not intended to limit the invention, and other circuits known by those skilled in the art can be applied to the embodiment of the invention.

It should be noted that the filter device formed by integrating the resonance device and the passive device in one die can broaden the passband width, has a high out-of-band rejection, and occupies less space in an RF front-end chip. In addition, compared with electrical connection of one resonance device and one passive device, the integration of the resonance device and the passive device in one die can reduce electrical transmission losses (because the electrical transmission path is shorter), thus improving the filter performance.

Figure 19:
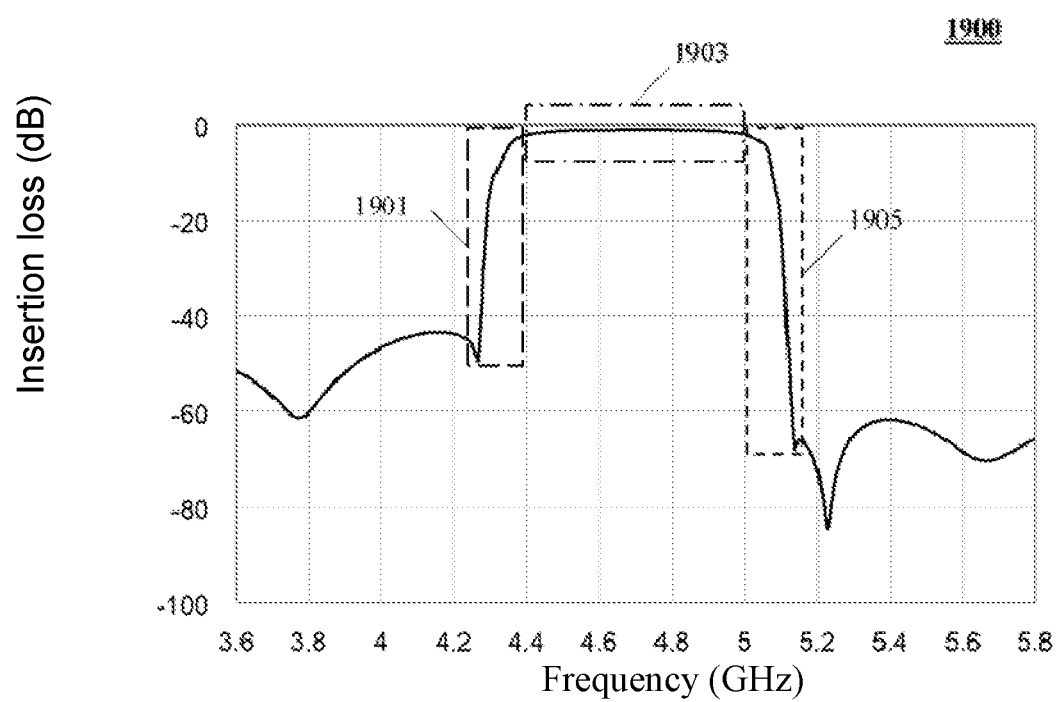
FIG. 19 is a structural diagram of cross-section A of a filter device 1900 in an embodiment of the invention.

FIG. 19 shows a performance diagram 1900 of a specific embodiment of the invention. Obviously, the invention can also be implemented by other filter devices different from the one described herein. Hence, the invention is not limited to the specific embodiment described below.

An embodiment of the invention provides a filter device (not shown) which comprises a die substrate, a band-pass filter device (such as the IPD 1840 in FIG. 18), a first BAW resonance device (such as the BAW resonance device 1820 in FIG. 18), and a second BAW resonance device (such as the BAW resonance device 1830 in FIG. 18), wherein the die substrate is located on first sides of the first BAW resonance device and the second BAW resonance device, the band-pass filter device is located on second sides of the first BAW resonance device and the second BAW resonance device, and the first sides of the first BAW resonance device and the second BAW resonance device are opposite to the second sides of the first BAW resonance device and the second BAW resonance device.

In this embodiment, the die substrate, the first BAW resonance device, the second BAW resonance device, and the band-pass filter device are located in one die.

In this embodiment, in an equivalent circuit (not shown) of the filter device, the first BAW resonance device and the second BAW resonance device are located on two sides of the band-pass filter device respectively, wherein a signal is input to the first terminal, passes through the first BAW resonance device, then passes through the band-pass filter device, and finally passes through the second BAW resonance device, and a filtered signal is output via the second terminal.

As shown in FIG. 19, the performance diagram 1900 of the filter device includes an insertion loss curve, wherein the horizontal axis of the insertion loss curve represents frequency (unit: GHz), and the vertical axis of the insertion loss curve represents insertion loss (unit: dB). The insertion loss curve includes a first out-of-band rejection region 1901, a band-pass region 1903 and a second out-of-band rejection region 1905, wherein the first out-of-band rejection region 1901 is mainly based on the first BAW resonance device, the band-pass region 1903 is mainly based on the band-pass filter device, and the second out-of-band rejection 1905 is mainly based on the second BAW resonance device.

In this embodiment, the first out-of-band rejection region 1901 has a high out-of-band rejection (over −40 dB), and the second out-of-band rejection region 1905 has a high out-of-band rejection (over −60 dB).

It should be noted that the insertion loss curve and the filter device can be applied to 5G n79band (4.4 to 5 GHz).

It should be noted that the filter device formed by integrating the resonance device and the passive device in one die can broaden the passband width, has a high out-of-band rejection, and occupies less space in an RF front-end chip.

An embodiment of the invention further provides an RF front-end device which comprises, but is not limited to, at least one of the filter device provided by one of the aforementioned embodiments, and a power amplification device, wherein the filter device is electrically connected to the power amplification device.

An embodiment of the invention further provides an RF front-end device which comprises, but is not limited to, at least one filter device provided by one of the aforementioned embodiments, and a low-noise amplification device, wherein the filter device is electrically connected to the low-noise amplification device.

An embodiment of the invention further provides an RF front-end device which comprises, but is not limited to, a multiplexing device, wherein the multiplexing device comprises at least one filter device provided by one of the aforementioned embodiments.

An embodiment of the invention further provides a wireless communication device which comprises, but is not limited to, the RF front-end device provided by one of the aforementioned embodiments, an antenna and a baseband processing device, wherein a first terminal of the RF front-end device is electrically connected to the antenna, and a second terminal of the RF front-end device is electrically connected to the baseband processing device.

To sum up, a resonance device (such as an SAW resonance device or a BAW resonance device) and a passive device (such as an IPD) can be integrated in one die to form an RF filter device, which can broaden the passband width, has a high out-of-band rejection, and occupies less space in an RF front-end chip.

In addition, compared with electrical connection of one resonance device and one passive device, the integration of the resonance device and the passive device in one die can reduce electrical transmission losses, thus improving the filter performance.

It should be understood that the examples and embodiments in this specification are merely illustrative ones, and various modifications and amendments can be made by those skilled in the art without departing from the spirit and scope defined by this application and the appended claims.

The invention claimed is:

1. A filter device, comprising:
 a plurality of resonance devices having a first side and a second side opposite to the first side, the plurality of resonance devices including:
  a first resonance device comprising:
   a first piezoelectric layer;
   a first electrode layer; and
   a second electrode layer;
  a second resonance device comprising:
   a second piezoelectric layer;
   a third electrode layer; and
   a fourth electrode layer; and a third resonance comprising:
  a third piezoelectric layer; and
  a fifth electrode layer located on the third piezoelectric layer;
a substrate located on the first side;
a passive device located on the second side; and
a connector that connects the plurality of resonance devices to the passive device, the connector including at least one of a bump and a through hole,
wherein the substrate, the plurality of resonance devices and the passive device are located in a die.

2. The filter device according to claim 1, wherein the plurality of resonance devices includes at least one SAW resonance device or BAW resonance device.

3. The filter device according to claim 1, wherein the passive device comprises, but is not limited to, at least one of a capacitor, an inductor, a resistor and a through hole.

4. The filter device according to claim 1, wherein the passive device includes, but is not limited to, an IPD, and the IPD is formed through a semiconductor process.

5. The filter device according to claim 1, wherein the fifth electrode layer comprises an interdigital transducer.

6. The filter device according to claim 1, wherein the fifth electrode layer comprises first electrode bars and second electrode bars, a polarity of the first electrode bars is different from that of the second electrode bars, and the first electrode bars and the second electrode bars are disposed alternately.

7. The filter device according to claim 1, wherein the third resonance device further comprises a third intermediate layer, the third piezoelectric layer is located on the third intermediate layer, the substrate and the third piezoelectric layer are located on two sides of the third intermediate layer, and the third intermediate layer is configured to block leaky waves or is configured for temperature compensation.

8. The filter device according to claim 7, wherein the third resonance device further comprises a fourth intermediate layer, the third intermediate layer is located on the fourth intermediate layer, the substrate and the third intermediate layer are located on two sides of the fourth intermediate layer, and the fourth intermediate layer is configured to block leaky waves.

9. The filter device according to claim 1, wherein the third resonance device further comprises a second reflection layer, the third piezoelectric layer is located on the second reflection layer, and the substrate and the third piezoelectric layer are located on two sides of the second reflection layer.

10. The filter device according to claim 9, wherein the second reflection layer comprises third sub-reflection layers and fourth sub-reflection layers, and the third sub-reflection layers and the fourth sub-reflection layers are disposed alternately and are composed of different materials.

11. The filter device according to claim 9, wherein the second reflection layers include Bragg reflection layers.

12. The filter device according to claim 1, wherein the substrate is composed of, but not limited at least one of the following materials: aluminum nitride, aluminum oxide alloy, gallium nitride, zinc oxide, lithium tantalite, lithium niobate, lead zirconate titanate and lead magnesium niobate-lead titanate.

13. The filter device according to claim 12, wherein the plurality of resonance devices comprises a fourth resonance device, the fourth resonance device comprises a sixth electrode layer located on the substrate, and the sixth electrode layer comprises an interdigital transducer.

14. The filter device according to claim 13, wherein the fourth resonance device further comprises a temperature compensation layer located on the substrate and covering the sixth electrode layer.

15. An RF front-end device, comprising a power amplification device and at least one filter device according to claim 12, wherein the power amplification device is connected to the filter device.

16. A wireless communication device, comprising an antenna, a baseband processing device and the RF front-end device according to claim 15, wherein the antenna is connected to a first terminal of the RF front-end device, and a baseband processing device is connected to a second terminal of the RF front-end device.

17. An RF front-end device, comprising a low-noise amplification device and at least one filter device according to claim 12, wherein the low-noise amplification device is connected to the filter device.

18. A wireless communication device, comprising an antenna, a baseband processing device and the RF front-end device according to claim 17, wherein the antenna is connected to a first terminal of the RF front-end device, and a baseband processing device is connected to a second terminal of the RF front-end device.

19. An RF front-end device, comprising a multiplexing device, wherein the multiplexing device comprises at least one filter device according to claim 12.

20. A wireless communication device, comprising an antenna, a baseband processing device and the RF front-end device according to claim 19, wherein the antenna is connected to a first terminal of the RF front-end device, and a baseband processing device is connected to a second terminal of the RF front-end device.

21. An RF front-end device, comprising a power amplification device and at least one filter device according to claim 1, wherein the power amplification device is connected to the filter device.

22. A wireless communication device, comprising an antenna, a baseband processing device and the RF front-end device according to claim 21, wherein the antenna is connected to a first terminal of the RF front-end device, and a baseband processing device is connected to a second terminal of the RF front-end device.

23. An RF front-end device, comprising a low-noise amplification device and at least one filter device according to claim 1, wherein the low-noise amplification device is connected to the filter device.

24. A wireless communication device, comprising an antenna, a baseband processing device and the RF front-end device according to claim 23, wherein the antenna is connected to a first terminal of the RF front-end device, and a baseband processing device is connected to a second terminal of the RF front-end device.

25. An RF front-end device, comprising a multiplexing device, wherein the multiplexing device comprises at least one filter device according to claim 1.

26. A wireless communication device, comprising an antenna, a baseband processing device and the RF front-end device according to claim 25, wherein the antenna is connected to a first terminal of the RF front-end device, and a baseband processing device is connected to a second terminal of the RF front-end device.

27. An RF front-end device, comprising a multiplexing device, wherein the multiplexing device comprises at least one filter device according to claim 1.

28. A wireless communication device, comprising an antenna, a baseband processing device and the RF front-end device according to claim 27, wherein the antenna is connected to a first terminal of the RF front-end device, and a baseband processing device is connected to a second terminal of the RF front-end device.

29. A filter device, comprising:
at least one resonance device having a first side and a second side opposite to the first side, the at least one resonance device including:
a first resonance device comprising:
a first cavity;
a first electrode layer, at least one part of the first electrode layer being located in or over the first cavity;
a first piezoelectric layer covering the first cavity, the first cavity and the first piezoelectric layer being located on two sides of at least one part of the first electrode layer; and
a second electrode layer located on the first piezoelectric layer, the first electrode layer and the second electrode layer being located on two sides of the first piezoelectric layer;
a substrate located on the first side;
a passive device located on the second side; and
a connector that connects the at least one resonance device to the passive device,
wherein the substrate, the at least one resonance device and the passive device are located in a die.

30. The filter device according to claim 29, wherein the substrate comprises the first cavity and a first groove; the first groove is located on a horizontal side of the first cavity and is communicated with the first cavity; the first electrode layer has a first terminal located in the first cavity and a second terminal located in the first groove, and a depth of the first groove is equal to a thickness of the first electrode layer; and the first piezoelectric layer is located on the first electrode layer, is a flat layer and covers the substrate.

31. The filter device according to claim 30, wherein the substrate comprises the first cavity, the first electrode layer is located over the first cavity and covers the first cavity, and the first piezoelectric layer is located over the substrate and covers the first electrode layer.

32. The filter device according to claim 31, wherein the first piezoelectric layer comprises a first protruding part located over the first electrode layer, and the second electrode layer comprises a second protruding part located on the first protruding part.

33. The filter device according to claim 32, wherein the first protruding part is trapezoidal or rectangular, and the second protruding part is trapezoidal or rectangular.

34. The filter device according to claim 32, wherein the first cavity is located on the substrate; the first electrode layer is located on the substrate and comprises a third protruding part located over the first cavity, and the first cavity and the first piezoelectric layer are located on two sides of the third protruding part; the first piezoelectric layer is located on the substrate and comprises a fourth protruding part located over the third protruding part; and the second electrode layer comprises a fifth protruding part located on the fourth protruding part.

35. The filter device according to claim 34, wherein the third protruding part is trapezoidal, arched or rectangular, the fourth protruding part is trapezoidal, arched or rectangular, and the fifth protruding part is trapezoidal, arched or rectangular.

36. The filter device according to claim 34, wherein the first resonance device further comprises a first intermediate layer, the substrate and the first piezoelectric layer are located on two sides of the first intermediate side, and the first intermediate layer is configured to block leaky waves, comprises the first cavity and is composed of, but not limited to, at least one of the following materials: polymer, insulating dielectric and polysilicon.

37. The filter device according to claim 36, wherein the first intermediate layer further comprises a second groove, and the second groove is located on a horizontal side of the first cavity and is communicated with the first cavity; a first terminal of the first electrode layer is located in the first cavity, a second terminal of the first electrode layer is located in the second groove, and a depth of the second groove is equal to a thickness of the first electrode layer; and the first piezoelectric layer is located on the first electrode layer, is a flat layer and covers the first intermediate layer.

38. The filter device according to claim 36, wherein the first electrode layer is located over the first cavity and covers the first cavity, and the first piezoelectric layer is located over the first intermediate layer and covers the first electrode layer.

39. The filter device according to claim 36, wherein the first resonance device further comprises a second intermediate layer, the substrate and the first piezoelectric layer are located on two sides of the second intermediate layer, the second intermediate layer is configured to block leaky waves, the first cavity is located on the second intermediate layer, and the second intermediate layer is composed of, but not limited to, at least one of the following materials: polymer, insulating dielectric and polysilicon.

40. The filter device according to claim 39, wherein the first electrode layer is located on the second intermediate layer, and the first electrode layer comprises a sixth protruding part located over the first cavity, and the first cavity and the first piezoelectric layer are located on two sides of the sixth protruding part; the first piezoelectric layer is located on the second intermediate layer and comprises a seventh protruding part located over the sixth protruding part; and the second electrode layer comprises an eighth protruding part located on the seventh protruding part.

41. The filter device according to claim 40, wherein the sixth protruding part is trapezoidal, arched or rectangular, the seventh protruding part is trapezoidal, arched or rectangular, and the eighth protruding part is trapezoidal, arched or rectangular.

42. An RF front-end device, comprising a power amplification device and at least one filter device according to claim 9, wherein the power amplification device is connected to the filter device.

43. A wireless communication device, comprising an antenna, a baseband processing device and the RF front-end device according to claim 42, wherein the antenna is connected to a first terminal of the RF front-end device, and a baseband processing device is connected to a second terminal of the RF front-end device.

44. An RF front-end device, comprising a low-noise amplification device and at least one filter device according to claim 29, wherein the low-noise amplification device is connected to the filter device.

45. A wireless communication device, comprising an antenna, a baseband processing device and the RF front-end device according to claim 44, wherein the antenna is connected to a first terminal of the RF front-end device, and a baseband processing device is connected to a second terminal of the RF front-end device.

46. An RF front-end device, comprising a multiplexing device, wherein the multiplexing device comprises at least one filter device according to claim 29.

47. A wireless communication device, comprising an antenna, a baseband processing device and the RF front-end device according to claim 46, wherein the antenna is connected to a first terminal of the RF front-end device, and a baseband processing device is connected to a second terminal of the RF front-end device.

48. A filter device, comprising:
a plurality of resonance devices having a first side and a second side opposite to the first side, the plurality of resonance devices comprising:
a first resonance device comprising:
a first piezoelectric layer;
a first electrode layer; and
a second electrode layer; and
a second resonance device comprising:
a first reflection layer,
a third electrode layer located on the first reflection layer;
a second piezoelectric layer located over the first reflection layer and covering the third electrode layer; and
a fourth electrode layer located on the second piezoelectric layer, the third electrode layer and the fourth electrode layer being located on two sides of the second piezoelectric layer;
a substrate located on the first side;
a passive device located on the second side; and
a connector that connects the plurality of resonance devices to the passive device,
wherein the substrate, the plurality of resonance devices and the passive device are located in a die.

49. The filter device according to claim 48, wherein the first reflection layer is located on the substrate and comprises first sub-reflection layers and second sub-reflection layers, and the first sub-reflection layers and the second sub-reflection layers are disposed alternately and are composed of different materials.

50. The filter device according to claim 48, wherein the first reflection layers include Bragg reflection layers.

51. The filter device according to claim 48, wherein the first resonance device further comprises a first cavity and a second intermediate layer, the first electrode layer is located on the second intermediate layer, and the first electrode layer comprises a sixth protruding part located over the first cavity, and the first cavity and the first piezoelectric layer are located on two sides of the sixth protruding part; the first piezoelectric layer is located on the second intermediate layer and comprises a seventh protruding part located over the sixth protruding part; and the second electrode layer comprises an eighth protruding part located on the seventh protruding part, the second piezoelectric layer comprises a ninth protruding part located over the third electrode layer, and the fourth electrode layer comprises a tenth protruding part located on the ninth protruding part.

52. An RF front-end device, comprising a power amplification device and at least one filter device according to claim 48, wherein the power amplification device is connected to the filter device.

53. A wireless communication device, comprising an antenna, a baseband processing device and the RF front-end device according to claim 52, wherein the antenna is connected to a first terminal of the RF front-end device, and a baseband processing device is connected to a second terminal of the RF front-end device.

54. An RF front-end device, comprising a low-noise amplification device and at least one filter device according to claim 48, wherein the low-noise amplification device is connected to the filter device.

55. A wireless communication device, comprising an antenna, a baseband processing device and the RF front-end device according to claim 54, wherein the antenna is connected to a first terminal of the RF front-end device, and a baseband processing device is connected to a second terminal of the RF front-end device.

56. An RF front-end device, comprising a multiplexing device, wherein the multiplexing device comprises at least one filter device according to claim 48.

57. A wireless communication device, comprising an antenna, a baseband processing device and the RF front-end device according to claim 56, wherein the antenna is connected to a first terminal of the RF front-end device, and a baseband processing device is connected to a second terminal of the RF front-end device.

* * * * *